(12) United States Patent
Hanzawa et al.

(10) Patent No.: US 8,456,940 B2
(45) Date of Patent: Jun. 4, 2013

(54) SEMICONDUCTOR DEVICE

(75) Inventors: Satoru Hanzawa, Hachioji (JP); Hitoshi Kume, Musashino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/312,620

(22) Filed: Dec. 6, 2011

(65) Prior Publication Data

US 2012/0075926 A1 Mar. 29, 2012

Related U.S. Application Data

(63) Continuation of application No. 13/112,567, filed on May 20, 2011, now Pat. No. 8,094,489, which is a continuation of application No. 12/890,636, filed on Sep. 25, 2010, now Pat. No. 7,983,109, which is a continuation of application No. 12/335,418, filed on Dec. 15, 2008, now Pat. No. 7,830,706.

(30) Foreign Application Priority Data

Dec. 27, 2007 (JP) .................................. 2007-335614

(51) Int. Cl.
*G11C 5/14* (2006.01)
*G11C 11/00* (2006.01)

(52) U.S. Cl.
USPC ........................ 365/226; 365/163; 365/189.09

(58) Field of Classification Search
USPC ......................................................... 365/226
See application file for complete search history.

(56) References Cited

U.S. PATENT DOCUMENTS

| | | | |
|---|---|---|---|
| 6,879,505 B2 | 4/2005 | Scheuerlein | |
| 6,922,768 B2 | 7/2005 | Honda et al. | |
| 7,110,286 B2 | 9/2006 | Choi et al. | |
| 7,262,990 B2 | 8/2007 | Cho et al. | |
| 7,327,600 B2 * | 2/2008 | Norman | 365/158 |
| 7,394,680 B2 | 7/2008 | Toda et al. | |
| 7,463,502 B2 | 12/2008 | Stipe | |
| 7,580,278 B2 | 8/2009 | Cho et al. | |
| 7,606,059 B2 | 10/2009 | Toda | |
| 7,619,945 B2 * | 11/2009 | Norman | 365/226 |
| 7,663,900 B2 | 2/2010 | Stipe | |

(Continued)

FOREIGN PATENT DOCUMENTS

| | | |
|---|---|---|
| JP | 2003-060171 A | 2/2003 |
| JP | 2004-266220 A | 9/2004 |
| JP | 2007-501519 A | 1/2007 |
| WO | WO 2005/017904 A1 | 2/2005 |

OTHER PUBLICATIONS

Kwang-Jin Lee et al., "A 90nm 1.8V 512Mb Diode-Switch PRAM with 266MB/s Read Throughput", IEEE International Solid-State Circuits Conference, Digest of Technical Papers, USA, 2007, pp. 472-473 and 616.

*Primary Examiner* — Son Mai
(74) *Attorney, Agent, or Firm* — Miles & Stockbridge P.C.

(57) ABSTRACT

A phase change memory capable of highly reliable operations is provided. A semiconductor device has a memory array having a structure in which memory cells are stacked including memory layers using a chalcogenide material and diodes, and initialization conditions and write conditions are changed according to the layer in which a selected memory cell is positioned. The initialization conditions and write conditions (herein, reset conditions) are changed according to the operation by selecting a current mirror circuit according to the operation and by a control mechanism of a reset current in a voltage select circuit and the current mirror circuit.

11 Claims, 29 Drawing Sheets

U.S. PATENT DOCUMENTS

| | | | |
|---|---|---|---|
| 7,688,621 B2 | 3/2010 | Cho et al. | |
| 7,692,951 B2 | 4/2010 | Toda et al. | |
| 7,715,250 B2 | 5/2010 | Norman | |
| 7,752,381 B2 | 7/2010 | Wong | |
| 7,813,210 B2 | 10/2010 | Norman | |
| 7,859,884 B2 | 12/2010 | Scheuerlein | |
| 7,978,499 B2* | 7/2011 | Hosono et al. | 365/148 |
| 8,111,572 B2* | 2/2012 | Norman | 365/209 |
| 8,179,730 B2* | 5/2012 | Shimizu et al. | 365/189.09 |
| 2001/0037435 A1 | 11/2001 | Van Doren | |
| 2002/0093846 A1 | 7/2002 | Kang | |
| 2004/0232460 A1 | 11/2004 | Kajiyama | |
| 2005/0169037 A1 | 8/2005 | Nishihara | |
| 2006/0157679 A1 | 7/2006 | Scheuerlein | |
| 2006/0197115 A1 | 9/2006 | Toda | |
| 2007/0153653 A1 | 7/2007 | Kim et al. | |
| 2007/0253242 A1 | 11/2007 | Parkinson et al. | |
| 2008/0034153 A1 | 2/2008 | Lee et al. | |
| 2008/0086588 A1 | 4/2008 | Danilak et al. | |
| 2009/0119450 A1 | 5/2009 | Saeki et al. | |
| 2009/0141532 A1 | 6/2009 | Nagashima et al. | |
| 2009/0219750 A1 | 9/2009 | Tokiwa et al. | |
| 2010/0027309 A1* | 2/2010 | Park | 365/63 |
| 2010/0058127 A1 | 3/2010 | Terao et al. | |

* cited by examiner

FIG. 6

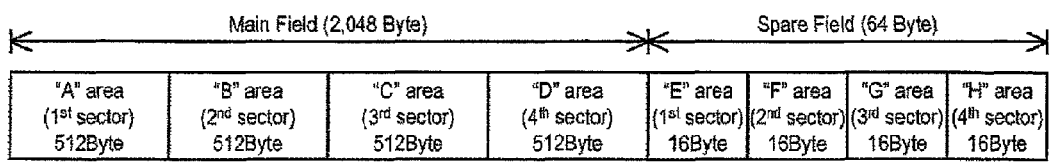

| "A" area (1st sector) 512Byte | "B" area (2nd sector) 512Byte | "C" area (3rd sector) 512Byte | "D" area (4th sector) 512Byte | "E" area (1st sector) 16Byte | "F" area (2nd sector) 16Byte | "G" area (3rd sector) 16Byte | "H" area (4th sector) 16Byte |
|---|---|---|---|---|---|---|---|

FIG. 7

| Sector | Main Field (Column Address 0 to 2,047) | | Spare Field (Column Address 2,048 to 2,111) | |
|---|---|---|---|---|
| | Area Name | Column Address | Area Name | Column Address |
| 1st 528-Byte Sector | A | 0 to 511 | E | 2,048 to 2,063 |
| 2nd 528-Byte Sector | B | 512 to 1,023 | F | 2,064 to 2,079 |
| 3rd 528-Byte Sector | C | 1,024 to 1,535 | G | 2,080 to 2,095 |
| 4th 528-Byte Sector | D | 1,536 to 2,047 | H | 2,096 to 2,111 |

FIG. 8

| Address Type | Memory Plane | Memory Layer | Block | | | | | | | | | | | Page | | | | | |
|---|---|---|---|---|---|---|---|---|---|---|---|---|---|---|---|---|---|---|---|
| Symbol | IA30 | IA29 IA28 | IA27 | IA26 | IA25 | IA24 | IA23 | IA22 | IA21 | IA20 | IA19 | IA18 | IA17 | IA16 | IA15 | IA14 | IA13 | IA12 |

| Target Memory Layer For Reset | Memory Layer Select Signal | | | Reset Current |
|---|---|---|---|---|
| | LS3B | LS2B | LS1B | |
| First Layer | 1 | 1 | 1 | Irst0 |
| Second Layer | 1 | 1 | 0 | (m+1) × Irst0 |
| Third Layer | 1 | 0 | 1 | (k+1) × Irst0 |
| Fourth Layer | 0 | 1 | 1 | (j+1) × Irst0 | j > k > m

| Operation Mode | VARY Voltage |
| --- | --- |
| Initialization of First Memory Layer | V0 |
| Initialization of Second Memory Layer | V1(>V0) |
| Initialization of Third Memory Layer | V2(>V1) |
| Initialization of Fourth Memory Layer | V3(>V2) |
| Read/Write of First Memory Layer | VDD |
| Read/Write of Second Memory Layer | VDD |
| Read/Write of Third Memory Layer | VDD |
| Read/Write of Fourth Memory Layer | VDD |

| Target Memory Layer For Reset | Memory Layer Select Signal | | | | Reset Current Iret |
|---|---|---|---|---|---|
| | LS3B | LS2B | LS1B | LS0B | |
| First Layer | 1 | 1 | 1 | 0 | Irst0 |
| Second Layer | 1 | 1 | 0 | 1 | 2 × Irst0 |
| Third Layer | 1 | 0 | 1 | 1 | 3 × Irst0 |
| Fourth Layer | 0 | 1 | 1 | 1 | 4 × Irst0 |

FIG. 23

| Grade | Valid Memory layer | Internal Address IA[28:27] | Internal Address After Translation EA[28:27] |
|---|---|---|---|
| One-Layer Valid Chip | First Layer | 00 | 00 |
| | Second Layer | | 01 |
| | Third Layer | | 10 |
| | Fourth Layer | | 11 |
| Two-Layer Valid Chip | First, Second Layers | 00, 01 | 00, 01 |
| | First, Third Layers | | 00, 10 |
| | First, Fourth Layers | | 00, 11 |
| | Second, Third Layers | | 01, 10 |
| | Second, Fourth Layers | | 01, 11 |
| | Third, Fourth Layers | | 10, 11 |
| Three-Layer Valid Chip | First, Second, Third Layers | 00, 01, 10 | 00, 01, 10 |
| | First, Second, Fourth Layers | | 00, 01, 11 |
| | First, Third, Fourth Layers | | 00, 10, 11 |
| | Second, Third, Fourth Layers | | 01, 10, 11 |
| Four-Layer Valid Chip | First, Second, Third, Fourth Layers | 00, 01, 10, 11 | 00, 01, 10, 11 |

FIG. 24

| Input Command | IN1 | TPRG1 | TRD1 | PRG1 | RD1 | |
|---|---|---|---|---|---|---|
| | IN2 | TPRG1 | TRD2 | PRG1 | RD2 | |
| Chip Internal Signal | CTL4 | | | | | |
| | INIT | TEST | | NORM | | |
| Operation Mode | Initialization | 1 | 0 | | 0 | CA[28:27] |
| | Test Read/Write | 0 | 1 | | 0 | IA[28:27] |
| | | 0 | 0 | | 0 | IA[28:27] |
| | Normal Read/Write | 0 | 0 | | 1 | EA[28:27] |

FIG. 27

| Input Command | | IN1 | TPRG1 | TRD1 | RLS1 | PRG1 | RD1 | - |
| --- | --- | --- | --- | --- | --- | --- | --- | --- |
| | | IN2 | TPRG1 | TRD2 | RLS2 | PRG1 | RD2 | |
| Chip Internal Signal | | CTL4 | | | | | | CA[28:27] |
| | | INIT | TEST | | | NORM | | |
| Operation Mode | Initialization | 1 | 0 | | | 0 | | IA[28:27] |
| | Test Read/Write | 0 | 1 | | | 0 | | IA[28:27] |
| | Normal Read/Write | 0 | 0 | | | 1 | | EA[28:27] |

| ID1 | Maker Code |
|---|---|
| ID2 | Device Code |
| ID3 | Internal Chip Number |
| | Cell Type |
| | Number of Simultaneously Program Pages |
| | Interleave Program between Multiple Chips |
| | Cache Program |
| ID4 | Page Size |
| | Block Size |
| | Redundant Area Size |
| | Organization |
| | Serial Access Minimum |
| ID5 | Plane Number |
| | Plane Size |

| Target Memory Layer For Reset | Memory Layer Select Signal | | | | Pulse Width Of Reset Enable Signal |
|---|---|---|---|---|---|
| | LS3T | LS2T | LS1T | LS0T | |
| First Layer | 0 | 0 | 0 | 1 | Same As RST_EN0 |
| Second Layer | 0 | 0 | 1 | 0 | Same As RST_EN1 |
| Third Layer | 0 | 1 | 0 | 0 | Same As RST_EN2 |
| Fourth Layer | 1 | 0 | 0 | 0 | Same As RST_EN3 |

FIG. 36

| Operation Mode | INIT_EN (CTL4) | Memory Layer Select Signal | | | | VARY Voltage |
|---|---|---|---|---|---|---|
| | | LS3 | LS2 | LS1 | LS0 | |
| Initialization of First Memory Layer | 1 | 0 | 0 | 0 | 1 | V0 |
| Initialization of Second Memory Layer | 1 | 0 | 0 | 1 | 0 | V1(>V0) |
| Initialization of Third Memory Layer | 1 | 0 | 1 | 0 | 0 | V2(>V1) |
| Initialization of Fourth Memory Layer | 1 | 1 | 0 | 0 | 0 | V3(>V2) |
| Read/Write of First Memory Layer | 0 | 0 | 0 | 0 | 1 | VDD |
| Read/Write of Second Memory Layer | 0 | 0 | 0 | 1 | 0 | VDD |
| Read/Write of Third Memory Layer | 0 | 0 | 1 | 0 | 0 | VDD |
| Read/Write of Fourth Memory Layer | 0 | 1 | 0 | 0 | 0 | VDD |

SEMICONDUCTOR DEVICE

CROSS-REFERENCE TO RELATED APPLICATIONS

This application is a continuation of application Ser. No. 13/112,567 filed May 20, 2011, now U.S. Pat. No. 8,094,489 which is a continuation of application Ser. No. 12/890,636 filed Sep. 25, 2010 (now U.S. Pat. No. 7,983,109 issued Jul. 19, 2011), which is a continuation of Ser. No. 12/335,418 filed Dec. 15, 2008 (now U.S. Pat. No. 7,830,706 issued Nov. 9, 2010). The present application also claims priority from Japanese Patent Application No. JP 2007-335614 filed on Dec. 27, 2007, the content of which is hereby incorporated by reference into this application.

TECHNICAL FIELD OF THE INVENTION

The present invention relates to a semiconductor device, and relates to a technique effectively applied to a memory device including a memory cell that is formed by elements having different resistance values corresponding to memory information, in particular, to a memory device including a phase change memory using a memory cell which stores information by utilizing state changes of a chalcogenide material and discriminates the information by detecting the resistance value differences of the information.

BACKGROUND OF THE INVENTION

As a technology studied by the inventor of the present invention, for example, the following technology is conceivable for a semiconductor device including a phase change memory. A memory element uses a chalcogenide materials (or a phase change material) containing at least antimony (Sb) and tellurium (Te) such as a Ge—Sb—Te-based one, an Ag—In—Sb—Te-based one as a material of storage layers. A diode is used for a selection device. Characteristics of the phase change memory using the chalcogenide material and the diodes in this manner are described, for example, in IEEE International Solid-State Circuits Conference, Digest of Technical Papers, USA, 2007, p. 472-473 and 616 (Non-Patent Document 1).

FIG. 2 is a diagram showing a relation between pulse widths and temperatures required for phase change of a resistive memory element using a phase change material. When memory information '0' is to be written to this memory element, as shown in FIG. 2, a reset pulse that heats the element to a melting point Ta or more of the chalcogenide material and rapidly cools it is applied. The cooling time t1 is set to be short, for example, about 1 ns; as a result, the chalcogenide material is caused to be in a high-resistance amorphous (non-crystalline) state.

On the other hand, when memory information '1' is to be written, a set pulse that maintains the memory element in a temperature region lower than the melting point Ta and higher than a crystallization temperature Tx that is equal to or higher than a glass transition point is applied; as a result, the chalcogenide material is caused to be in a low-resistance polycrystalline state. Time t2 required for crystallization is different depending on the composition of the chalcogenide material. The temperature of the element shown in FIG. 2 is dependent on Joule heat generated by the memory element itself and the thermal diffusion to the periphery.

In Japanese Patent Application Laid-Open Publication No. 2003-060171 (Patent Document 1), memory cell characteristics and reading conditions of a semiconductor memory device having an array structure in which memory cells having ferroelectric layers are stacked interposing insulating layers are described. Specifically, since the thermal history of the memory cells is different in each layer, differences in the electrical characteristics of the memory cells are generated depending on the formed layers. In order to reliably read such memory cells, a method of changing a reference voltage according to the layer having the accessed memory cell is taught. Japanese Patent Application Laid-Open Publication No. 2007-501519 (Patent Document 2) describes memory cell characteristics of a semiconductor memory device having an array structure in which memory cells comprising a chalcogenide material are stacked. More specifically, it is described that the chalcogenide material has characteristics prone to be affected by formation steps of the stacked arrangement. Japanese Patent Application Laid-Open Publication No. 2004-266220 (Patent Document 3) describes a memory array structure of a stacked-type magnetic memory. Specifically, a method of changing the wiring structure, contact structure, etc. for each layer in order to prevent the writing characteristics from differing in each layer is described.

SUMMARY OF THE INVENTION

Prior to the present application, the inventors of the present application have studied about increasing the integration degree of a phase change memory using memory layers comprising a chalcogenide material and diodes. Particularly, in a study about a 3-D structure based on stacked memory arrays, the following two problems have been found out.

A first problem lies in that the thermal history of the memory cells differs in each layer and it may result in differences in electrical characteristics of the memory cells. Specifically, thermal load is larger in the memory array of a lower layer. Therefore, it is predicted that the resistance value after manufacturing is lower in a memory array of a lower layer. For a phase change memory, generally, a so-called initialization of applying a higher voltage or a larger current than a normal write operation to reduce the resistance value is carried out. If a bias in the initialization is set to a value adjusted for a memory array of an upper layer that requires a higher voltage or a larger current, excessive stress may be applied to the memory cells which are positioned in lower layers having lower resistance value, and the electrical characteristics of the memory layers may be deteriorated. Therefore, it is desired to adjust the voltage or current of the initialization according to the layer in which the memory cell to be initialized is formed.

A second problem lies in that the resistance values after a normal write operation may be varied due to the differences in the electrical characteristics of the memory cells which are posed due to the thermal history similar to the first problem. In the memory having the ferroelectric layers, i.e., a ferroelectric memory described in Patent Document 1 mentioned above, information is stored by applying an electric field to the ferroelectric substance and changing the direction of the intrinsic polarization. As a method of compensating for the differences in the electrical characteristics of the memory cells generated among formed layers, changing the writing voltage for each layer is conceivable. However, in this method, a voltage control circuit for changing the writing voltage for each layer is necessary to be provided, and thus it is not preferred because there are posed an increase of chip area in addition to an increase of transistor size. Accordingly, the differences in the electrical characteristics generated in the memory cells after the write operation had to be compensated for by adjusting the reading conditions (herein, reference voltage) as described in Patent Document 1.

Meanwhile, in the phase change memory cell, it can be predicted that characteristic deteriorations such as disturbance and endurance may be caused due to the differences in the state after writing. In order to avoid such problems, when operation conditions adjusted for a memory array of a lower layer that requires a higher voltage or a larger current are set in a reset operation for achieving a high-resistance state, excessive stress is applied to memory cells in memory arrays of positioned at upper layers having relatively low resistance values. As a result, the resistance value after resetting is increased more than needed, and there is a possibility that a reverse write operation cannot be carried out. Reversely, when the bias in the reset operation is set to a value necessary for the memory array of the upper layer, energy applied to the memory cells positioned in the lower layer having a relatively low resistance value becomes deficient; therefore, it may not be changed to a desired resistance value. However, when a read circuit common to the layers is formed on a silicon substrate in consideration of chip-area reduction, the cell resistance in the reset state has to be a constant value or more for realizing a reliable read operation. Therefore, a reset operation to make the memory cells positioned in any memory arrays have similar resistance values is desired.

A third problem lies in that the yield may be varied among the layers in which the memory cells are formed due to the influence of the thermal load described above. More specifically, in a chip architecture in the past, when a low-yield layer exists, the entire chip is judged to be defective, and the chip is discarded. In such an inspection method, the number of obtained chips per a wafer is reduced, and increase of the bit cost is caused as a result. In order to reduce the bit cost, it is desired to have an architecture such that judgment of non-defective products is carried out in a layer unit, and the chip can be considered to be a non-defective product and shipped if at least one high-yield layer is present.

Accordingly, in consideration of the forgoing problems and so forth, the present invention aims, as for a phase change memory having a memory array having a structure where memory cells are stacked, to control memory cells to have a desired resistance value by adjusting a drive voltage or drive current of initialization and writing according to the layer in which the memory cells are formed without deteriorating the electrical characteristics of a chalcogenide material. In addition, the present invention aims to achieve a memory array configuration in which performances of memory cells are evaluated in the layer unit and, if at least one high-yield layer is present, merely the layer can be used. The above and other objects and novel characteristics of the present invention will be apparent from the description of this specification and the accompanying drawings.

The typical ones of the inventions disclosed in this application will be briefly described as follows.

There are comprised: a first memory cell provided in a first layer and having a first memory element to which memory information is written by a current; a second memory cell provided in a second layer, which is formed above the first layer, and having a second memory element to which memory information is written by a current; a first address decoder outputting a first layer select signal for selecting the first layer or a second layer select signal for selecting the second layer; and a write driver supplying a first current to the first memory cell when first memory information is to be written to the first memory cell and supplying a second current, which has a magnitude different from that of the first current, to the second memory cell when the first memory information is to be written to the second memory cell, where the write driver controls the magnitudes of the first current and the second current according to the first layer select signal and the second layer select signal.

Alternatively, there are comprised: a first bit line provided in a first layer; a second bit line provided in a second layer formed above the first layer; a first word line and a second word line intersecting with the first bit line and the second bit line; a first memory cell provided at an intersecting point of the first bit line and the first word line and comprising a first memory element, to which memory information is written by a current, and a first rectifier element which causes a current to flow in a direction from the first word line to the first bit line via the first memory element; a second memory cell provided at an intersecting point of the first bit line and the second word line and comprising a second memory element, to which memory information is written by a current, and a second rectifier element which causes a current to flow in a direction from the second word line to the first bit line via the second memory element; a third memory cell provided at an intersecting point of the second bit line and the first word line and comprising a third memory element, to which memory information is written by a current, and a third rectifier element which causes a current to flow in a direction from the first word line to the second bit line via the third memory element; and a fourth memory cell provided at an intersecting point of the second bit line and the second word line and comprising a fourth memory element, to which memory information is written by a current, and a fourth rectifier element which causes a current to flow in a direction from the second word line to the second bit line via the fourth memory element, where a first voltage is supplied to the first or second memory cell when initializing the first or second memory cell, and a second voltage, which is different from the first voltage, is supplied to the third or fourth memory cell when initializing the third or fourth memory cell.

Still alternatively, there are comprised: a first memory cell provided in a first layer and having a first memory element to which memory information is written by a current; a second memory cell provided in a second layer formed above the first layer and having a second memory element to which memory information is written by a current; an address translation circuit which translates a first address signal for selecting either one of the first layer and the second layer to a second address signal for selecting the other one of the first layer and the second layer; a multiplexer which selects either one of the first address signal and the second address signal outputted by the address translation circuit; and a first address decoder which generates a first layer select signal for selecting the first layer or a second layer select signal for selecting the second layer according to the signal selected by the multiplexer.

To describe an effect obtained by typical aspects of the present invention will be briefly, a highly reliably operated phase change memory can be realized.

BRIEF DESCRIPTIONS OF THE DRAWINGS

FIG. 6 is a diagram showing a page configuration example shown in FIG. 5 in the semiconductor device of the first embodiment of the present invention;

FIG. 7 is a diagram showing an example of column address allocation in the semiconductor device of the first embodiment of the present invention;

FIG. 8 is a diagram showing an example of row address allocation in the semiconductor device of the first embodiment of the present invention;

FIG. 23 is a diagram showing an address translation table in the address translation circuit shown in FIG. 22 in the semiconductor device of the third embodiment of the present invention;

FIG. 24 is a diagram showing functions of a multiplexer shown in FIG. 22 in the semiconductor device of the third embodiment of the present invention;

FIG. 27 is a diagram showing an example of correspondence between input commands and chip internal signals in the semiconductor device of the fourth embodiment of the present invention;

Figure 35:
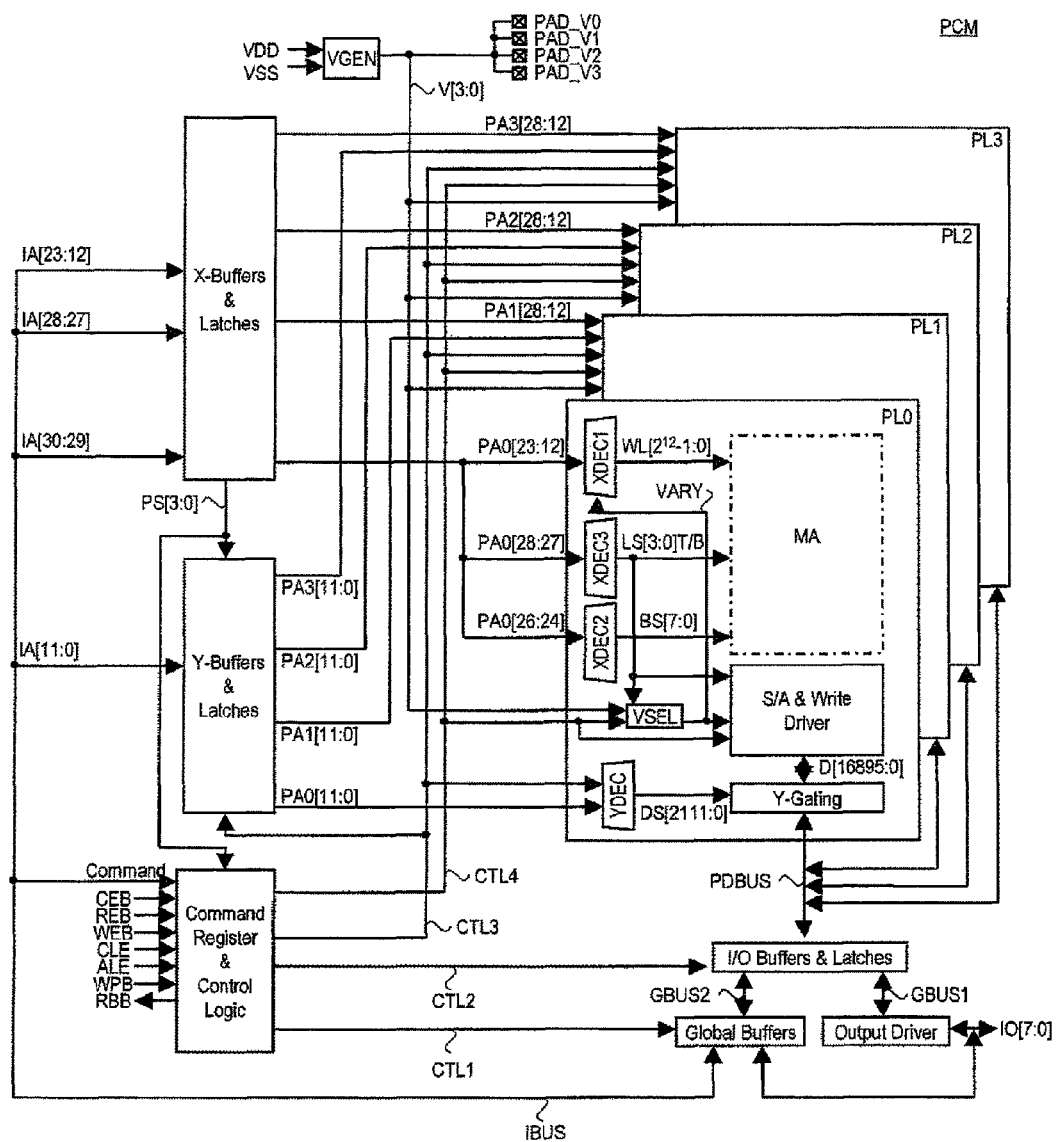

FIG. 35 is a diagram showing a configuration example of a circuit block of a main part of a phase change memory included in a semiconductor device of an eighth embodiment of the present invention; and FIG. 36 is a diagram showing settings of an array voltage VARY and functions of a voltage select circuit shown in FIG. 35 in the semiconductor device of the eighth embodiment of the present invention.

DESCRIPTIONS OF THE PREFERRED EMBODIMENTS

Hereinafter, embodiments of the present invention will be described in detail with reference to the accompanying drawings. Note that, components having the same function are denoted by the same reference symbols throughout the drawings for describing the embodiment, and the repetitive description thereof will be omitted. Also, circuit elements configuring respective functional blocks of the embodiments are formed on a semiconductor substrate such as single crystal silicon by an integrated circuit technology of, for example, a publicly-known CMOS (complementary metal-oxide semiconductor transistor) although there is no particular limitation.

Note that, in the embodiments, MOS (Metal Oxide Semiconductors) transistors are used as an example of MISFETs (Metal Insulator Semiconductor Field Effect Transistors). In the drawings, a symbol of an arrow is arranged to the gate of a p-channel type MOS transistor (PMOS transistor) so as to distinguish it from an n-channel type MOS transistor (NMOS transistor). While a connection of the substrate potential of the MOS transistor is not particularly and clearly shown in the drawings, a method of connection thereof is not particularly limited as long as it is in a range that enables normal operation of the MOS transistor.

First Embodiment

The present embodiment provides a phase change memory capable of changing initialization conditions and write conditions depending on a layer in which a selected memory cell is positioned.

First, according to FIG. 1 to FIG. 4, the phase change memory according to the present invention will be described. The phase change memory according to the present invention has a structure in which memory cells comprising storage layers comprising a chalcogenide material and cell-selecting diodes are stacked via insulating layers.

<<Overall Configuration of Stacked Phase Change Memory>>

Figure 1:
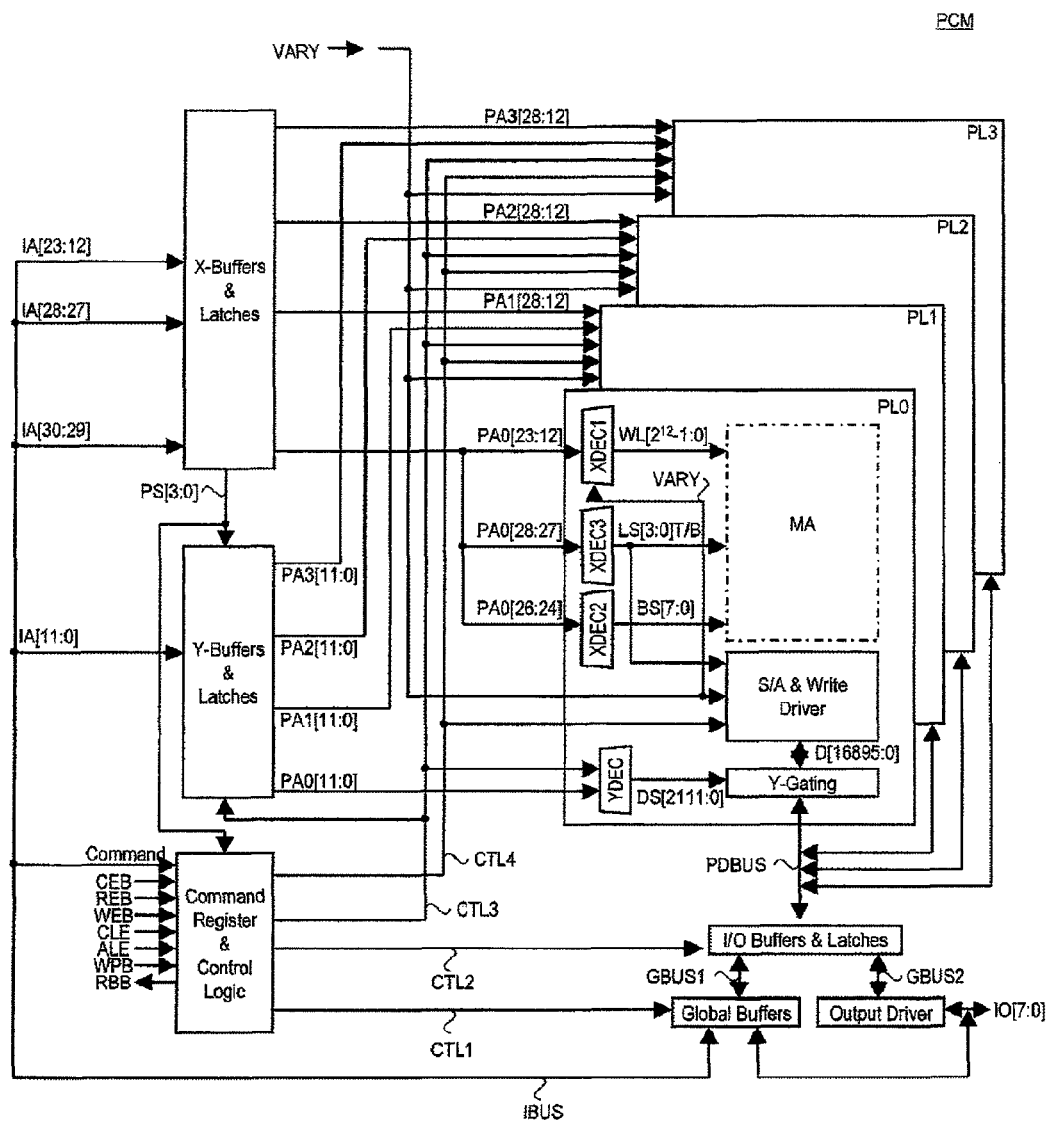
FIG. 1 is a diagram showing a configuration example of a circuit block of a main part of a phase change memory included in a semiconductor device of a first embodiment of the present invention.
Figure 2:
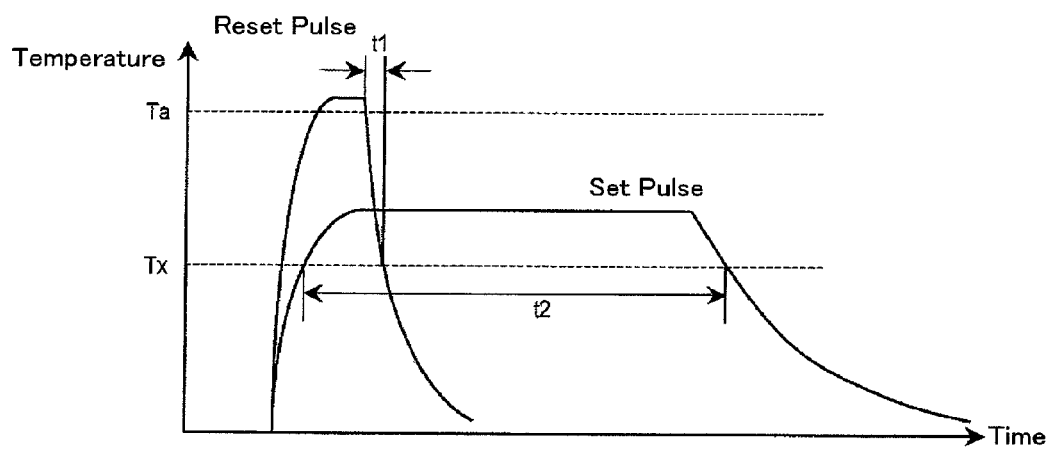
FIG. 2 is a diagram showing a relation between pulse widths and temperatures required for phase change of a resistive element using a phase change material.

FIG. 1 is a circuit block diagram showing a configuration example of a main part of the phase change memory in a semiconductor device of a first embodiment according to the present invention. In this diagram, as an example, a configuration in the case of 8 Gbit comprising 2-Gbit memory planes PL0 to PL3 is shown. Each of the memory planes comprises a memory array MA, a sense amplifier & write driver (S/A & Write Driver), Y-gating (Y-Gating), a column decoder YDEC, a first row decoder XDEC1, a second row decoder XDEC2, and a third row decoder XDEC3. As described above, the memory array MA has a configuration in which memory cells comprising storage layers formed of the chalcogenide material, and cell-selecting diodes are three-dimensionally disposed in matrix. The sense amplifier & write driver is a circuit block which reads memory information from the memory array and carries out a write operation of memory information to the memory array. The Y-gating (Y-Gating) is a circuit block which is connected to the sense amplifier & write driver via pairs of data line D[16895:0] of 16896 $\{=(2^{14}+2^9)-1\}$ lines, and also connected to a block of input/output line buffer & block of latch (I/O Buffers & Latches) via a plane data bus PDBUS to transmit and receive memory information.

The operations of the respective decoders will be described below with focusing on the memory plane PL0. The column decoder YDEC is a circuit block for selecting a gate to be activated in the Y-gating mutually connecting the above-described sense amplifier & write driver and the block of input/output line buffer & block of latch. The first to third row decoders XDEC1 to XDEC3 are circuit blocks which select memory cells to be activated. The first row decoder XDEC1 is the circuit block which selects and activates one line from 4095 $(=2^{12}-1)$ word lines WL[4095:0] according to an internal address PA0[23:12] distributed for the memory plane PL0. The second row decoder XDEC2 is the circuit block which selects and activates one line from eight bit-line select signals BS[7:0] according to an internal address PA0[26:24] distributed for the memory plane PL0. The third row decoder XDEC3 is the circuit block which selects and activates one pair from four pairs of memory layer select signals (LS7T, LS7B) to (LS0T, LS0B) according to an internal address PA0[28:27] distributed for the memory plane PL0.

An array voltage VARY is a voltage supplied from outside the phase change memory PCM to the first row decoder XDEC1 and the write driver WD. The array voltage herein is controlled in the manner shown in FIG. 12 which will be described later. More specifically, when initialization is to be carried out, the voltage is set to any of V0 to V3 so that the voltage is an optimal voltage to the corresponding layer and supplied to the first row decoder XDEC1 and the write driver WD; and, when a read or write operation is to be carried out, independent of the layer, the voltage is always set to VDD and supplied to the first row decoder XDEC1 and the write driver WD.

Herein, the array voltage VARY is has the feature to supply an optimal initialization voltage for each layer in the initialization.

In this manner, by virtue of the configuration that supplies the array voltage VARY controlled for each layer to the first row decoder XDEC1, initialization of memory cells can be carried out by the optimal voltage for each layer according to the resistance value that is varied among layers due to differences in electrical characteristics. Herein, the voltage used for initialization can be also generated by providing a voltage generator in the interior as shown in a seventh embodiment, which will be described later. However, since carrying out merely one time of initialization in a test or the like upon shipping is satisfactory, the voltage can be supplied from outside without providing the voltage generator in the interior. When power is supplied from outside, increase of the chip area caused by the internal voltage generator can be prevented.

Moreover, by virtue of the configuration that supplies the array voltage controlled for each layer to the write driver WD, the amount of the current Iint that flows through the memory cells in the initialization can be controlled to an appropriate value, and the initialization can be carried out with higher precision.

Next, peripheral circuit blocks will be described. Memory information, command signals, and address signals used in the phase change memory according to the present invention are transmitted and received from an input/output line IO[7:0] via global buffers (Global Buffers) or an output driver (Output Driver). The global buffers (Global Buffers) are controlled by a block of control signals CTL1. The memory information is transferred further between the global buffers (Global Buffers) or the output driver (Output Driver) and the block of input/output line buffer & block of latch (I/O Buffers & Latches) via a corresponding global bus GBUS1 or a global bus GBUS2. The block of input/output line buffer & the block of latch (I/O Buffers & Latches) are controlled by a block of control signals CTL2. The command signals are transferred from the global buffers (Global Buffers) to command register & control logic (Command register & Control Logic) via a chip internal bus IBUS. Also, the address signals IA[30:0] are transferred to X-buffers and latches also via IBUS. Specifically, the address signal IA[11:0] is transferred to the Y-buffers & latches (Y-Buffers & Latches). The address signal IA[30:12] is transferred to X-buffers & latches (X-buffers & Latches).

The command register & control logic (Command register & Control Logic) further distributes blocks of control signal CTL1 to CTL4 to blocks of phase change memory according to a memory plane select signal PS[3:0] outputted from the X-buffers and latches (X-Buffers & Latches) and a plurality of control signals. The plurality of control signals are, specifically, a command latch enable signal CLE, an address latch enable signal ALE, a chip enable signal CEB, a read enable signal REB, a write enable signal WEB, a write protect signal WPB, and a ready/busy signal RBB. The command latch enable signal CLE is a signal for activating the above-described command register which temporarily stores the command signals. The address latch enable signal ALE is a signal for activating the above-described Y-buffers and latches which temporarily store the address signal. The chip enable signal CEB is a signal for selecting a phase change memory chip. The read enable signal REB is a signal for activating the above-described output driver and outputting memory information while generating a column address in the interior of the chip. The write enable signal WEB is a signal for receiving the memory information, command signals, and address signals. The write protect signal WPB is a signal for preventing accidental write operations upon power on. The ready/busy signal RBB is a signal which notifies whether the interior of the chip is currently under a read operation and a write operation or not.

The Y-buffers and latches (Y-Buffers & Latches) are a circuit block for transferring the address signal IA[11:0] to the memory planes PL0 to PL3 according to a block of control signals CTL3 and the memory plane select signal PS[3:0]. For example, if a memory plane control signal PS0 is activated, the internal address signal PA0[11:0] is activated. When the internal address signal is selectively distributed to the activated memory plane, the power consumption required for driving signal lines can be suppressed.

The X-buffers & latches (X-Buffers & Latches) are a circuit block for transferring the address signal IA[30:12] to the memory planes PL0 to PL3 according to the memory plane select signal PS[3:0]. As same as the internal address signal PA0[11:0], the memory plane, which is the transfer destination, is selected by the memory plane control signals PS0 to PS3 generated according to the address signal IA[30:29].

<<Configuration of Memory Array>>

Figure 3:
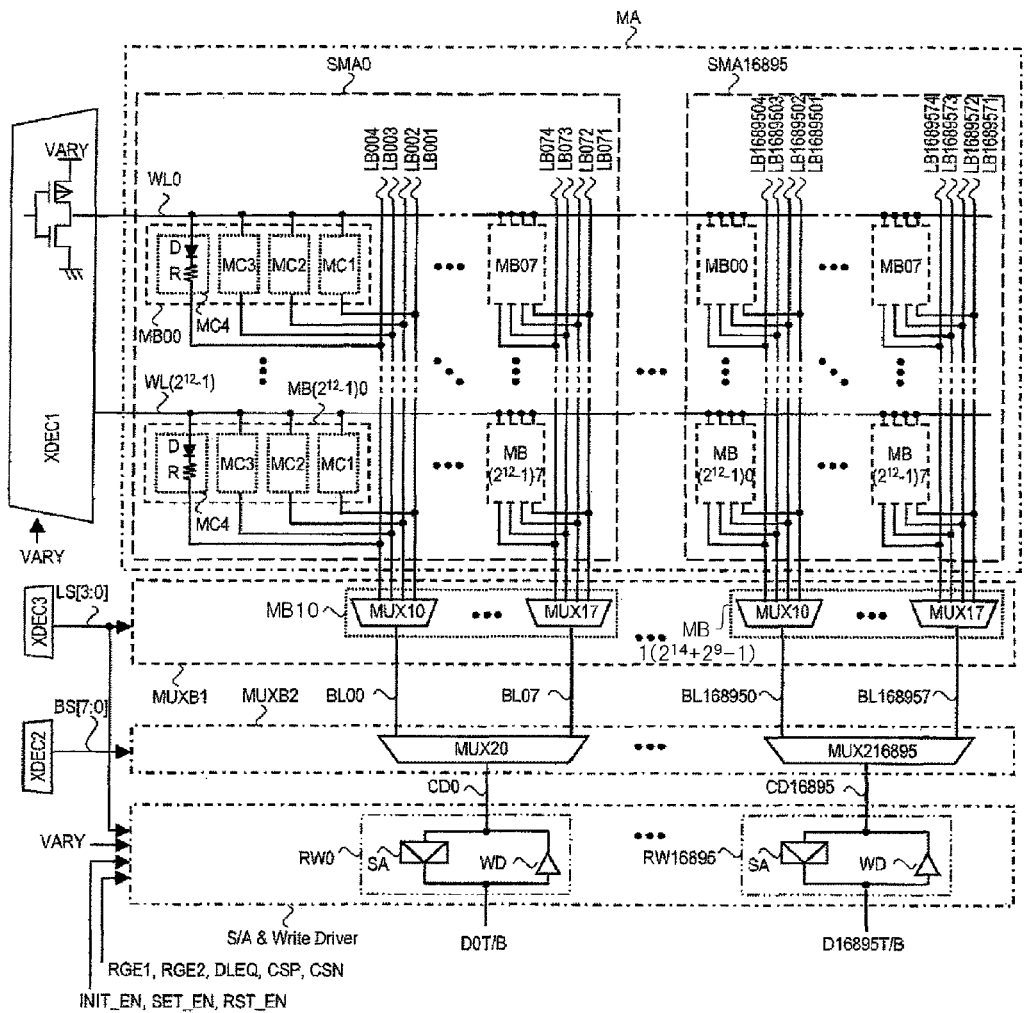
FIG. 3 is a diagram showing a memory array configuration example of the circuit block shown in FIG. 1 in the semiconductor device of the first embodiment of the present invention.

FIG. 3 is a diagram showing a detailed configuration example of the memory array MA shown in FIG. 1. When the memory array MA is configured in the manner shown in FIG. 3, the integration degree of the memory cells can be improved by virtue of the structure in which the memory cells comprising the memory layers using the chalcogenide material and the diodes are stacked. The details thereof will be described below.

Hereinafter, the unit of memory cells accessed by one read operation or write operation is referred to as a page. The memory array MA of FIG. 3 has 131072 ($=2^{17}$) pages. Each of the pages comprises a 2-kByte main field and a 64-Byte spare field; and, when these are summed up, they have a size of 2112 kByte. The memory array MA having such characteristics will be explained below in detail.

The memory array MA comprises 16896 ($=2^{14}+2^9$) sub-memory arrays SMA0 to SMA16895, a first block of multiplexer MUXB1, and a block of second multiplexer MUXB2. Each of the sub-memory arrays SMA0 to SMA16895 comprises blocks of stacked memory cell MB00 to MB($2^{12}$−1)7 disposed respectively at intersecting points of the 4096 ($=2^{12}$) word lines WL0 to WL4095 ($=$WL($2^{12}$−1)) and eight pairs of local bit-lines (LB001 to LB004)-(LB071 to LB074), for example, like the sub-memory array SMA0. Each of the blocks of stacked memory cell MB00 to MB($2^{12}$−1)7 comprises memory cells MC1 to MC4, each of which comprises a phase change resistive element R having the function of the storage layer using the chalcogenide material and the memory-cell-selecting diode D connected in series between the corresponding bit line and word line.

The first block of multiplexer MUXB1 comprises blocks of multiplexer MB10 to MB116895 corresponding to the 16896 ($=2^{14}+2^9$) sub-memory arrays SMA0 to SMA16895. Each of the blocks of multiplexer MB10 to MB116895 is a circuit in which, for example like a multiplexer MUX10 in the block of multiplexer MB10, one line is selected from the four local bit-lines LB001 to LB004 according to a memory layer select signal LS[3:0] and is connected to a bit line BL00.

The second block of multiplexer MUXB2 comprises multiplexers MUX20 to MUX216895 corresponding to the 16896 ($=2^{14}+2^9$) sub-memory arrays SMA0 to SMA16895. Each of the multiplexers MUX20 to MUX216895 is a circuit in which, for example like the multiplexer MUX20, one line is selected from eight local bit-lines BL00 to BL07 according to a bit line select signal BS[7:0] and is connected to a common data-line CD0.

FIG. 3 also shows the sense amplifier & write driver (S/A & Write Driver). The sense amplifier & write driver (S/A & Write Driver) comprises read/write circuits RW0 to RW16895 corresponding to the 16896 ($=2^{14}+2^9$) sub-memory arrays SMA0 to SMA16895. Each of the read/write circuits RW0 to RW16895 is disposed between the common data line CD0 and a pair of data lines D0T/B, for example like the read/write circuit RW0. The read/write circuit RW0 comprises a sense amplifier SA and a write driver WD.

In FIG. 3, in each of the blocks of stacked memory cell MB00 to MB($2^{12}$−1)7, with respect to the memory cell MC1 of a first layer to the memory cell MC4 of a fourth layer, the bit lines are provided to the respective memory cells, and the word line short-circuits the memory cells MC1 to MC4 collectively by the same wiring. A similar configuration with respect to this configuration can be realized by providing word lines for the respective memory cells, and by providing a bit line collectively by a same wiring. However, since the plurality of word lines are connected to select circuits in the row decoder XDEC1, respectively, a PMOS having a large area is connected to each of them. Therefore, the present embodiment capable of suppressing the number of PMOSes by assembling a plurality of word lines is more effective in the point of suppressing increase of the circuit area.

Figure 4:
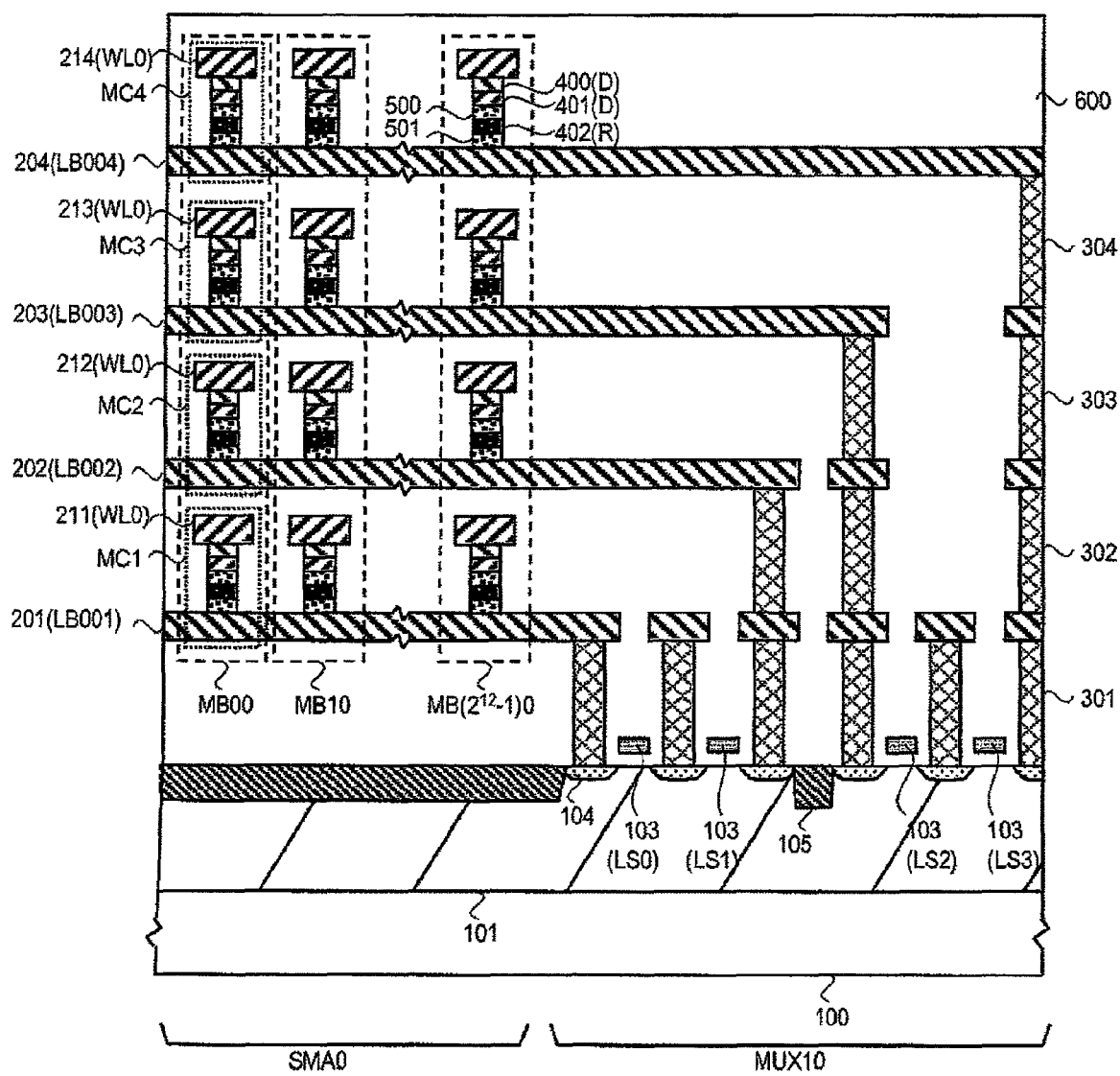
FIG. 4 is a diagram showing a cross section of stacked memory cells included in the memory array shown in FIG. 3 in the semiconductor device of the first embodiment of the present invention.

FIG. 4 shows a cross-sectional structure of the blocks of stacked memory cell and the first block of multiplexer shown in FIG. 3. FIG. 4 shows, as an example, the blocks of stacked memory cell MB00 to MB($2^{12}$−1)0 connected to the pairs of the local bit-lines LB001 to LB004 and the multiplexer MUX10. Each block of stacked memory cell according to the present embodiment has a feature such that the four memory cells MC1 to MC4 shown in FIG. 3 are stacked.

The blocks of stacked memory cells MB00 to MB($2^{12}$−1)0 and the multiplexer MUX10 are formed in a p-well region 101 formed on a p-type silicon substrate 100. 103 denotes a polysilicon layer serving as gate electrodes of NMOS transistors that the multiplexer MUX10 has. The symbols in parentheses are the memory layer select signals LS[3:0]. 104 denotes an n-type diffusion layer region which serves as source electrodes or drain electrodes of the NMOS transistors. 105 denotes an oxide for separation to block conduction between the transistors.

201 to 204 denote first to fourth tungsten layers which serve as the local bit-lines LB001 to LB004. 211 to 214 denote fifth to eighth tungsten layers which serve as the word lines. The word line is shared in each block of stacked memory cell like WL0, and the fifth to eighth tungsten layers are mutually short-circuited at the positions not shown on the paper. The first to eighth tungsten layers are mutually isolated by interlayer insulators 600.

301 denotes a first contact for connecting the first tungsten layer and the n-type diffusion layer. 302 denotes a second contact for connecting the second tungsten layer and the first tungsten layer. 303 denotes a third contact for connecting the third tungsten layer and the second tungsten layer. 304 denotes a fourth contact for connecting the fourth tungsten layer and the third tungsten layer.

For example, like the memory cell MC1 in the block of stacked memory cell MB00, the memory cell is formed like a column between the tungsten layer (herein, 201) which serves as the local bit-line LB001 and the tungsten layer (herein, 211) which serves as the word line WL0. 400 denotes a p-type silicon layer of the PN diode, 401 denotes an n-type silicon layer of the PN diode, and 402 denotes the chalcogenide material layer. 500 denotes a ninth tungsten layer which serves as a buffer layer between the PN diode and the chalcogenide material layer, and S01 denotes a tenth tungsten layer which serves as a buffer layer between the chalcogenide material layer and the local bit-line. Herein, the memory cell can be also configured to have a select transistor and the chalcogenide material layer, where the word line is connected to a gate of the select transistor. However, the integration degree of the memory cell can be further improved by the configuration having the diode and the chalcogenide material layer like the present embodiment.

<<Memory Map>>

Figure 5:
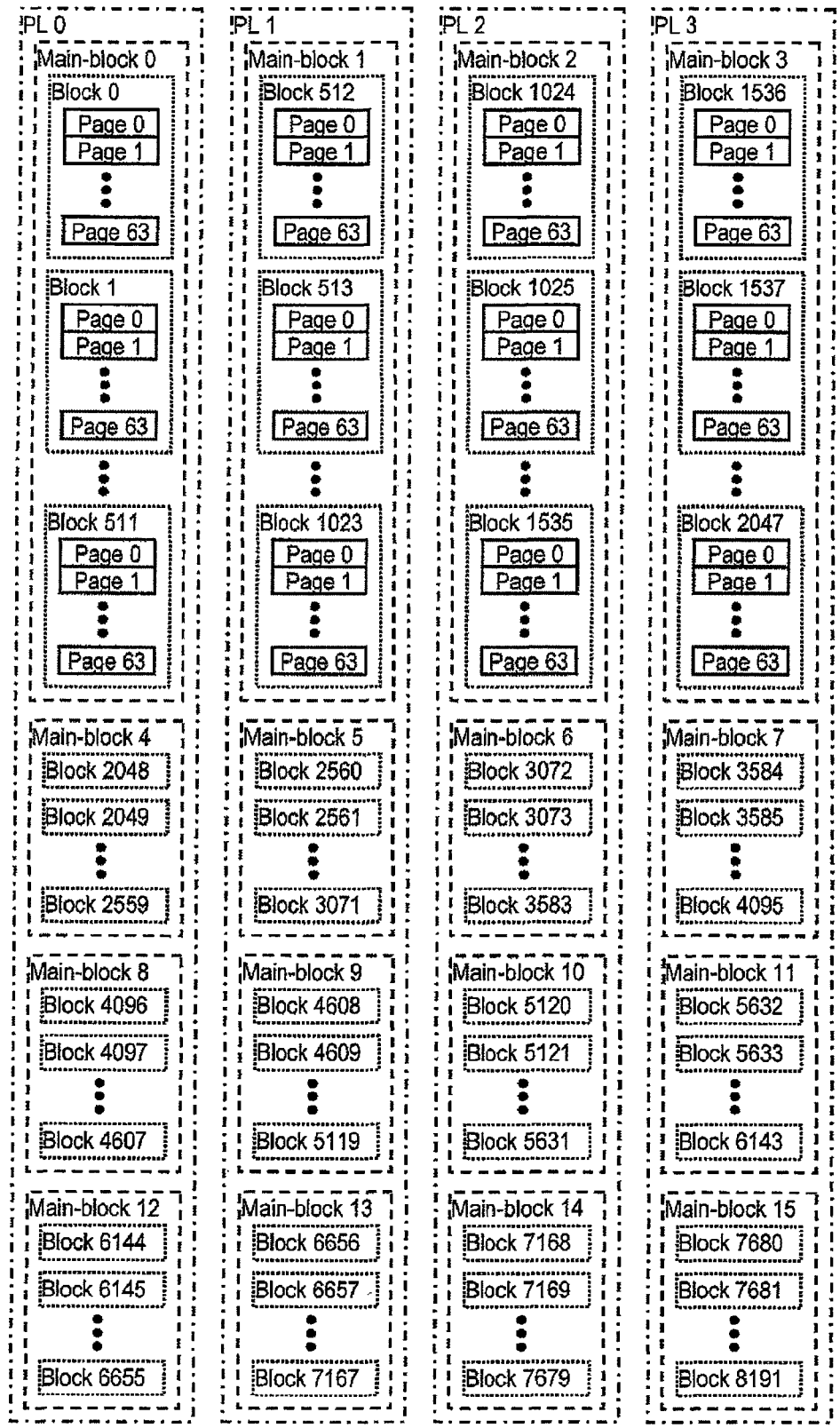
FIG. 5 is a diagram showing a memory map of the phase change memory shown in FIG. 1 in the semiconductor device of the first embodiment of the present invention.

Next, a memory map of the phase change memory according to the present embodiment will be described. FIG. 5 is a diagram showing an overview of the present memory map. Each of the memory planes PL0 to PL3 has a feature to comprise four main blocks (Main-block 0, Main-block 4, Main-block 8, and Main-block 12), for example like the memory plane PL0. These main blocks correspond to the stacked memory arrays; for example, the Main-block 0 is the memory array of the first layer, the Main-block 4 is the memory array of the second layer, the Main-block 8 is the memory array of the third layer, and the Main-block 12 is the memory array of the fourth layer. Each of the main blocks (Main-block 0 to Main-block 15) comprises 512 blocks (Block 0 to Block 511), for example like the Main-block 0. Further, each of the blocks (Block 0 to Block 511) comprises 64 pages (Page 0 to Page 63) like the Block 0.

FIG. 6 is a diagram showing a configuration of the page shown in FIG. 5. The page comprises a main field of 2048 ($=2^{11}$) byte and a spare field of 64 ($=2^8$) byte. The main field further has four fields (an A area to a D area or a first sector to a fourth sector) each of which is configured by 512 bytes. The spare field is configured by four fields (an E area to an H area or a fifth sector to an eighth sector) each of which comprising 16 bytes. Memory information is written to the main field, and one-bit error correction codes are written to the spare field. Corresponding to such a page configuration, the memory array shown in FIG. 3 comprises the 16896 ($=2^{14}+2^9$) sub-memory arrays. The sense amplifier and the write driver (S/A & Write Driver) comprise 16896 ($=2^{14}+2^9$) pairs of sense amplifiers and write drivers.

FIG. 7 is a diagram showing allocation of column addresses. The main field is specified by column addresses 0 to 2047. The spare field is specified by column addresses 2048 to 2111. These column addresses are generated by the address signal IA[11:0] shown in FIG. 1. Therefore, although details will be described later, 16896 ($=2^{14}+2^9$) bit memory information read from the memory array MA at one time is once stored in the sense amplifiers and outputted from the Y-gating (Y-Gating) 1 byte by 1 byte according to a data line select line DS[2111:0]. Reversely, memory information is stored in the write driver via the Y-gating (Y-Gating) 1 byte by 1 byte and, when 16896 ($=2^{14}+2^9$) bits are ready, they are written to the memory array MA at one time.

FIG. 8 is a diagram showing allocation of row addresses. The row addresses are generated by the address signal IA[30:12] shown in FIG. 1. The memory plane select signal PS[3:0] is generated by the address signal IA[30:29]. The memory layer select signal LS[3:0] is generated by an address signal IA[28:27]. The word lines WL0 to WL($2^{12}$−1) and bit-line select signals BS[7:0] for selecting pages are generated by an address signal IA[26:12].

<<Configuration of Sense Amplifier & Write Driver>>

Figure 9:
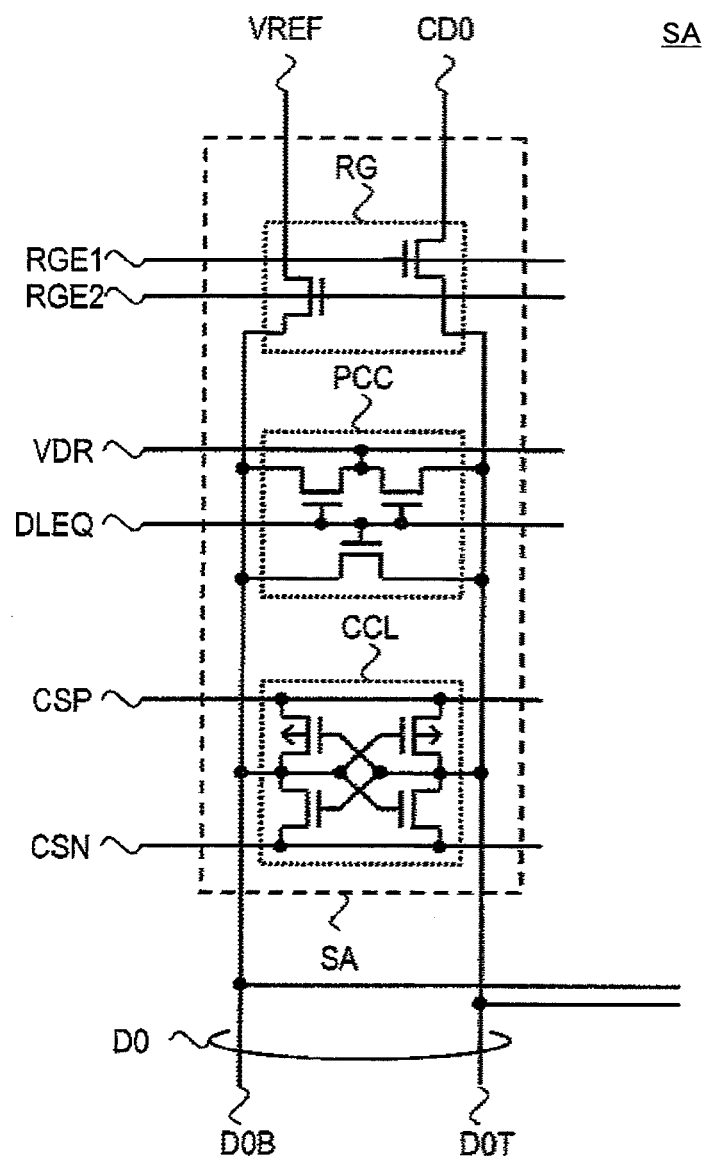
FIG. 9 is a diagram showing an example of a detailed configuration of a sense amplifier circuit of FIG. 1 included in the semiconductor device of the first embodiment of the present invention.

Hereinafter, a detailed configuration example of the sense amplifier & write driver (S/A & Write Driver) will be described. FIG. 9 shows the read/write circuit RW0 as an example. First, the sense amplifier SA has a publicly-known circuit configuration comprising a pre-charge circuit PCC, a cross-couple type latch amplifier CCL, and a pass gate RG.

The pre-charge circuit PCC comprising three NMOS transistors is activated by driving a data-line equalize signal DLEQ to a boosted voltage VPP which is higher than a supply voltage VDD during standby, so that the pair of data lines D0T and D0B is driven to a reference voltage VDR (herein, for example, VDD/2).

The cross-couple type latch amplifier CCL comprises two PMOS transistors and two NMOS transistors. During standby, common source lines CSP and CSN are driven to a pre-charge voltage (herein, the reference voltage VDR) which is same as the pair of data lines D0T and D0B. Meanwhile, in a read operation, when a signal corresponding to the information stored in a selected memory cell is generated in the data line D0T, the common source line CSP is driven to the supply voltage VDD and the common source line CSN is driven to a ground voltage VSS, so that the cross-couple type amplifier CCL is activated, and minute signals generated in the pair of the data lines D0T and D0B are amplified.

The pass gate RG is configured by two NMOS transistors inserted between the cross-couple type sense latch and the memory array. In the read operation, the pass gate RG is activated when pass gate activating signals RGE1 and RGE2 are driven to the boosted voltage VPP, so that the common data-line CD0 and the reference voltage VREF (herein, for example, VDD/2) and the cross-couple type latch amplifier CLL are connected, and the signal read from the selected memory cell is transferred to the cross-couple type sense latch CLL. Note that, the data-line equalize signal DLEQ, the common source lines CSP and CSN, and the pass gate activating signals RGE1 and RGE2 are components of the block of control signal CTL4.

Figures 10, 11:
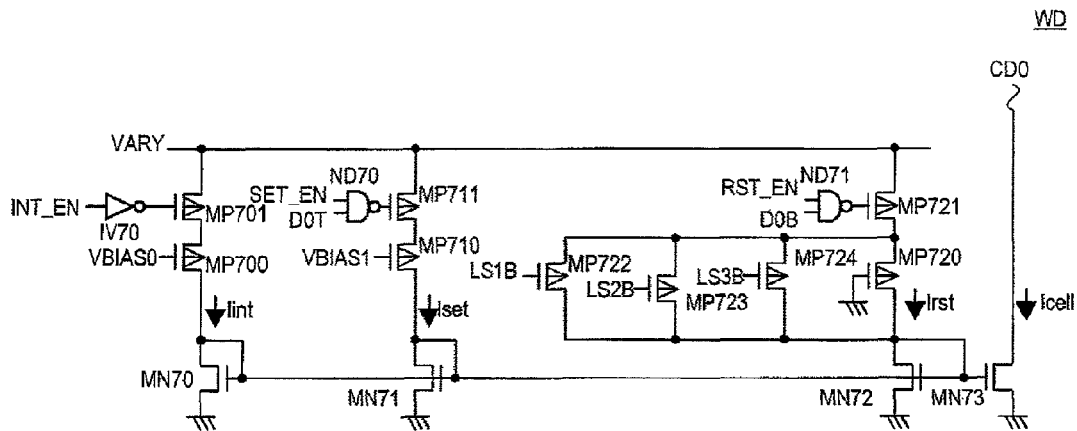
FIG. 10 is a diagram showing an example of a detailed configuration of a write driver of FIG. 1 included in the semiconductor device of the first embodiment of the present invention.
FIG. 11 is a diagram showing a relation between target memory layers for reset and reset currents in the write driver shown in FIG. 10 in the semiconductor device of the first embodiment of the present invention.

FIG. 10 shows a configuration of a write driver WD0. The write driver has a feature to control a current Irst that flows through the memory cell upon a reset according to memory layer select signals LS1B to LS3B to change the write conditions for the respective layers. By virtue of this configuration, in a reset operation of causing the memory cell to be in a high-resistance state, the resistance value can be controlled to a desired value for the respective layers according to differences in the electrical characteristics of the layers, and thus a highly reliable phase change memory can be realized.

A basic configuration of the write driver is three current mirror circuits comprising NMOS transistors MN70, MN71, MN72, and MN73 and has the following two features. The first feature is that the current mirror circuits are activated according to operations. The second feature is that the voltage value of the supplied array voltage VARY is controlled according to the operation mode.

First, a configuration of the current mirror circuit will be described. A first current mirror circuit is configured by a combination of the transistors MN70 and MN73. Between the transistor MN70 and the array voltage VARY, PMOS transistors MP700 and MP701 are inserted in series. A bias voltage VBIAS0 is inputted to a gate of the transistor MP700. A signal obtained by inverting an initialization enable signal INT_EN by an inverter IV700 is inputted to a gate of the transistor MP701. By virtue of such a configuration, a memory cell current Icell to be applied via the common data line CD0 is set to a value Iint required for initialization.

In this manner, the first current mirror circuit has a feature to control the initialization current of the memory cell independent of the memory layer select signals LS1B to LS3B. This is because, in initialization, the initialization voltage is controlled for the respective layers by controlling the array voltage VARY so that the initialization can be carried out under optimal conditions. Therefore, since the circuit that carries out control for the respectively layers according to the memory layer select signals is not provided, the circuit area can be reduced.

The second current mirror circuit has a configuration formed by a combination of the transistors MN71 and MN73. Between the transistor MN71 and the array voltage VARY, PMOS transistors MP710 and MP711 are inserted in series. A bias voltage VBIAS1 is inputted to a gate of the transistor MP710. An output signal of a two-input NAND circuit ND70 to which a set enable signal SET_EN and the data line D0T are inputted is inputted to the gate of the transistor MP711. When the memory cell is to be caused to be in a low resistance state, in other words, memory information "1" is to be written, this configuration controls the memory cell current Icell which is applied via the common data line CD0 to be a value Iset that is necessary for a set operation.

In this manner, as well as the first current mirror circuit, the second current mirror circuit also has a feature to control the set current Iset of the memory cell independent of the memory layer select signals LS1B to LS3B. This is because, in the set operation, the control for each of the layers according to the memory layer select signals is not required to be carried out, since the reset resistance is controlled to an appropriate value by the third current mirror circuit which will be described later. Therefore, the circuit configuration can be simplified, and the circuit area can be reduced.

Note that, in the above-described first current mirror circuit and second current mirror circuit, a circuit that carries out control for each of the layers may be provided.

The third current mirror circuit has a configuration formed by a combination of the transistors MN72 and MN73. Between the transistor MN72 and the array voltage VARY, PMOS transistors MP720, MP722, MP723, and MP724, and MP721 are inserted in series parallel. Herein, the gate widths of the transistors connected in parallel are set to be larger in order of the transistors MP720, MP722, MP723, and MP724. The ground voltage VSS is inputted to the gate of the transistor MP720. The inverted signals LS1B to LS3B of the memory layer select signals LS1T to LS3T are inputted to the gates of the transistors MP722, MP723, and MP724, respectively. Further, the output signal of a two-input NAND circuit ND71 to which a reset enable signal RST_EN and the data line D0B are inputted is inputted to the gate of the transistor MP721. When the memory cell is to be caused to be in the high resistance state, in other words, memory information "0" is to be written, this configuration controls the memory cell current Icell, which is applied via the common data line CD0, to be the value Irst corresponding to the selected memory layer as shown in FIG. 11. Specifically, when a memory cell of a first memory layer (lowermost layer) is to be subjected to a write operation, the transistor MP720 is conducted, thereby setting the set current Irst to Irst0. When a memory cell of a second memory layer is to be subjected to a write operation, the transistors MP720 and MP722 are conducted, thereby setting the reset current Irst to $(m+1) \times Irst0$. When a memory cell of a third memory layer is to be subjected to a write operation, the transistors MP720 and MP723 are conducted, thereby setting the reset current Irst to $(k+1) \times Irst0$. When a memory cell of a fourth (uppermost layer) memory layer is to be subjected to a write operation, the transistors MP720 and MP724 are conducted, thereby setting the reset current Irst to $(j+1) \times Irst0$. Herein, the coefficients m, k, and j are set to satisfy the relation $m<k<j$. Thus, the higher the layer of the memory array is, the larger the current to be applied to carry out the reset operation is. Consequently, the resistance values of the memory cells of the layers can be reliably controlled to desired resistance values. Note that, the reset current Irst is set to have a larger value than the set current Iset. The initialization enable signal INT_EN, the set enable signal SET_EN, and the reset enable signal RST_EN are components of the block of control signal CTL4.

As described above, the third current mirror circuit has a feature such that the transistors MP720, 722, 723, and 724 having different gate widths are connected in parallel and that the transistor to be conducted is selected according to the memory layer select signal. By virtue of such a configuration, optimal reset currents can be supplied to the layers, respectively.

Note that, the transistor MP720 may be removed since the transistor is in a conducted state. However, when the transistor MP720 is provided, there is an advantage that the base current for carrying out the reset operation of the first memory layer can be designed.

Figures 12, 13:
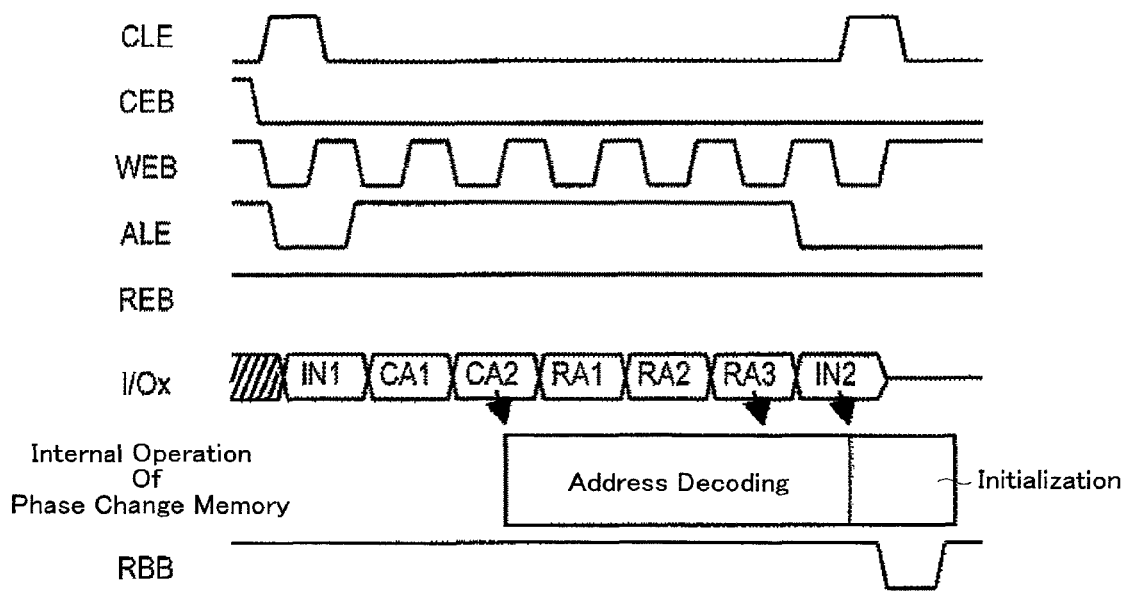
FIG. 12 is a diagram showing setting of an array voltage VARY for each of operations in the semiconductor device of the first embodiment of the present invention.
FIG. 13 is a diagram showing an example of initialization operation of the phase change memory included in the semiconductor device of the first embodiment of the present invention.

Next, the voltage value of the array voltage VARY supplied to the write derivers WD and the first row decoder XDEC1 will be described. FIG. 12 shows settings of the array voltage VARY for respective operations. In the case of initialization, the array voltage VARY having a value corresponding to the memory layer in which the selected cell is positioned is applied.

Specifically, when the memory cell of the first memory layer (lowermost layer) is to be initialized, the array voltage VARY is supplied as a first voltage V0. Hereinafter, in the same manner, when the memory cell of the second memory layer is to be initialized, the array voltage VARY is supplied as a second voltage V1 which is higher than the first voltage V0; when the memory cell of the third memory layer is to be initialized, a third voltage V2 which is higher than the second voltage V1 is supplied; and, when the memory cell of the fourth memory layer (uppermost layer) is to be initialized, a fourth voltage V3 which is higher than the third voltage V2 is supplied. Above-described voltages have the following relation.

$$VDD \geq V3 > V2 > V1 > V0 \qquad \text{(Expression 1)}$$

When the initialization is carried out by supplying the optimal voltages to the layers respectively, in this manner, deterioration of electrical characteristics caused by application of excessive stress to the memory layers can be prevented, and a highly reliable phase change memory can be realized.

Note that, in a read operation or a write operation, the array voltage VARY is set to the supply voltage VDD. This is because the array voltage is supplied from the outside of the phase change memory PCM, and the voltage generator is not provided in the inside. However, in the read operation, the state of the memory cell is not written; therefore, control of the array voltage VARY is not required. In the write operation, the reset operation and the set operation under the optimal conditions are enabled by the write driver shown in FIG. 10; therefore, by controlling the array voltage as shown in FIG. 12, in all the operations, optimal conditions can be provided for the respective layers.

<<Initialization>>

Operations of the phase change memory according to the present embodiment described above will be explained below. FIG. 13 shows an example of initialization. The command latch enable signal CLE at the ground voltage VSS is driven to a high level, and the chip enable signal CEB and the address latch enable signal ALE, which are at a high level, are driven to a low level. Then, when a first initialization command signal IN1 is inputted via input/output lines I/Ox (x=0 to 7), a first initialization command signal IN1 is retrieved to the phase change memory chip by the rising edge of the write enable signal WEB. Next, again, the command latch enable signal CLE at the high level, is driven to the low level, and the address latch enable signal ALE at the low level is driven to the high level so that a column address and a row address are inputted. Herein, since 0 to 2111 addresses are provided as shown in FIG. 7 as the column addresses, the column address requires 12 bits. Meanwhile, there are merely eight I/O pins for inputting addresses as shown in FIG. 1; therefore, the 12-bit column address is sequentially inputted separately in two times (CA1, CA2). Similarly, the row address requires 19 bits as shown in FIG. 8; therefore, it is sequentially inputted separately in three times (RA1, RA2, RA3). These addresses are retrieved to the phase change memory chip by the rising edge of the write enable signal WEB, and decoding of the addresses is sequentially carried out in the chip. Furthermore, the address latch enable signal ALE at the high level is driven to the low level, and the command latch enable signal CLE at the low level is driven to the high level so that a second initialization command signal IN2 is inputted to the input/output lines I/Ox (x=0 to 7). The second initialization command signal IN2 is retrieved to the phase change memory chip by the rising edge of the write enable signal WEB, thereby carrying out initialization. Note that, the ready/busy signal RBB at the high level is driven to the low level in the initialization.

Figure 14:
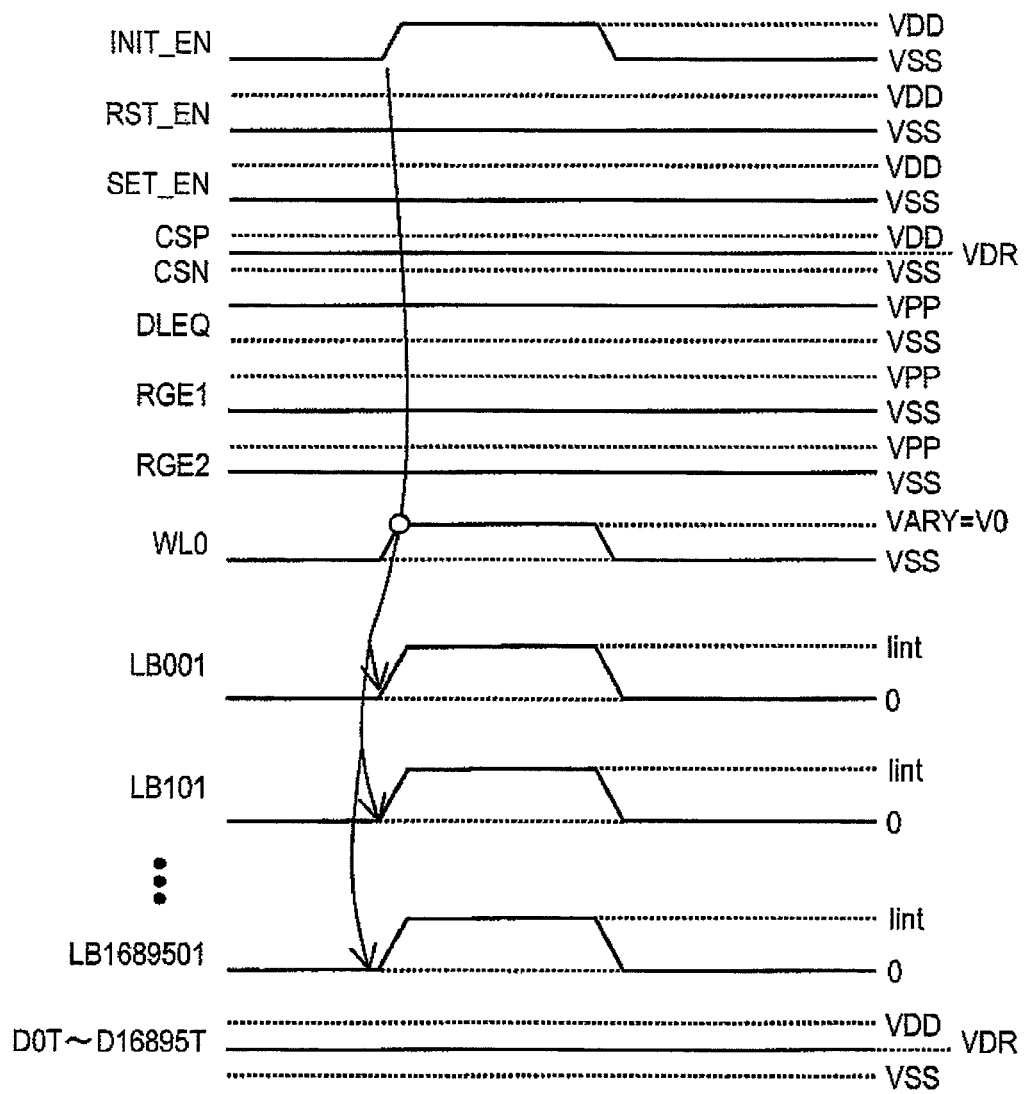
FIG. 14 is a diagram showing an example of an internal operation in the initialization operation of the phase change memory shown in FIG. 13 in the semiconductor device of the first embodiment of the present invention.

FIG. 14 is a diagram showing an example of a chip internal operation in the initialization of the phase change memory according to the present embodiment. This diagram shows operation waveforms of the case in which the memory cell MC1 which is in the lowermost layer of the block of stacked memory cell MB00 in the sub-memory arrays SMA0 to SMA16895 included in the memory array MA shown in FIG. 3 is initialized. To simplify the description, the operation waveforms of the first block of multiplexer MUXB1 and the second block of multiplexer MUXB2 are omitted; however, when the memory layer select signal LS0 and the bit line select signal BS0 are activated according to the second initialization command IN2 shown in FIG. 13, the local bit-lines LS001, LS101, ..., LS1689501 and the common data lines CD0, CD1, ..., CD16895 are respectively connected. Next, the initialization enable signal INIT_EN, which is at the ground voltage VSS, is driven to the supply voltage VDD, and the word line WL0, which is at the ground voltage VSS, is driven to a first array voltage V0; as a result, the initialization current Iint is applied to the corresponding local bit-lines LB001, LB101, ..., LB1689501, thereby carrying out initialization. Note that, it can be readily understood from above-described FIG. 12 that the array voltage applied to the word line has any of the voltage values of V0 to V3 according to the memory layer to which the selected memory cell belongs.

<<Write Operation>>

Figure 15:
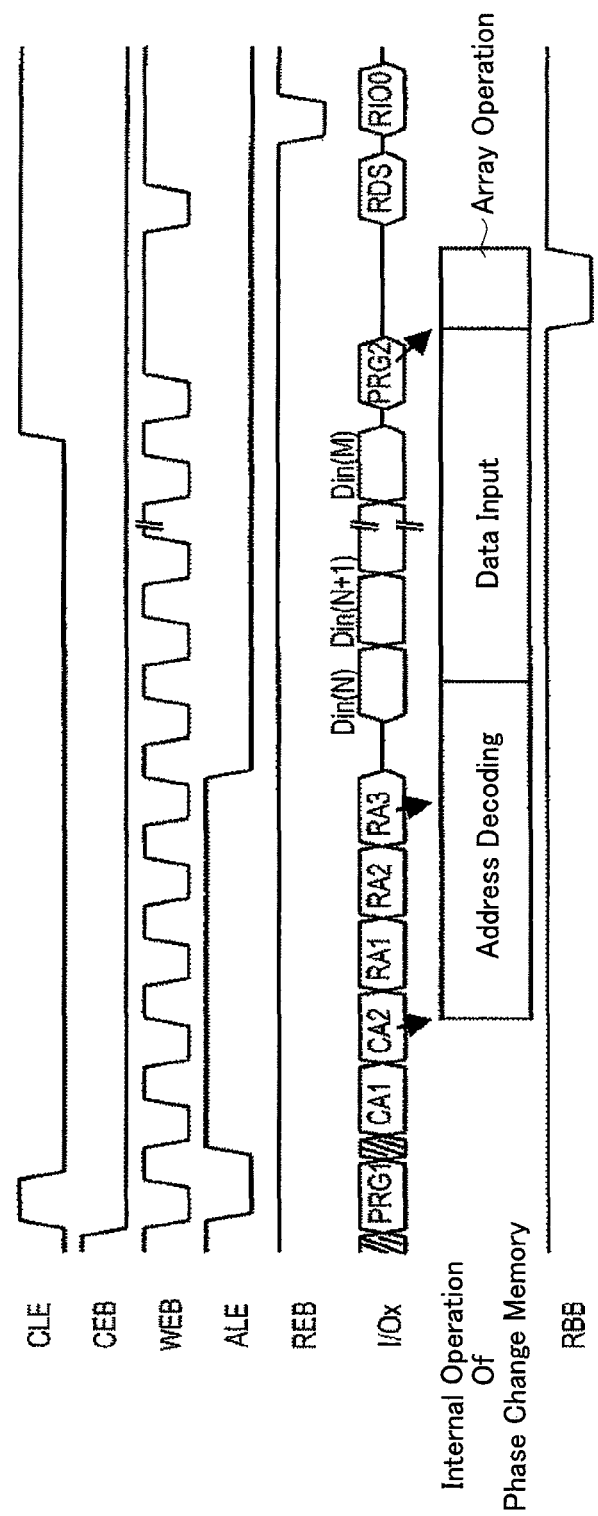
FIG. 15 is a diagram showing an example of a write operation of the phase change memory in the semiconductor device of the first embodiment of the present invention.

FIG. 15 shows an example of the write operation. The command latch enable signal CLE, which is at the low level, is driven to the high level, and the chip enable signal CEB and the address latch enable signal ALE, which are at the high level, are driven to the low level. Then, when a first program command signal PRG1 is inputted via the input/output lines I/Ox (x=0 to 7), the first program command signal PRG1 is retrieved to the phase change memory chip by the rising edge of the write enable signal WEB. Next, again, the command latch enable signal CLE at the high level is driven to the low level, the address latch enable signal ALE at the low level is driven to the high level, so that column addresses are sequentially inputted separately in two times (CA1, CA2), and row addresses are sequentially inputted separately in three times (RA1, RA2, RA3). These addresses are retrieved to the phase change memory chip by the rising edges of the write enable signal WEB, and decoding of the addresses is sequentially carried out in the chip. Furthermore, the address latch enable signal ALE, which is at the high level, is driven to the low level, and memory information pieces Din(N) to Din(M) are inputted via the input/output lines I/Ox (x=0 to 7). Subsequently, the command latch enable signal CLE, which is at the low level, is driven to the high level so that a second program command signal PRG2 is inputted to the input/output lines I/Ox (x=0 to 7). The second program command signal PRG2 is retrieved to the phase change memory chip by the rising edge of the write enable signal WEB, thereby carrying out the write operation. Note that, in the write operation, the ready/busy signal RBB, which is at the high level, is driven to the low level. After the write operation is finished, and after the ready/busy signal RBB, which is at the low level, is driven to the high level, a state read command signal RDS is inputted. The state read command signal RDS is retrieved to the phase change memory chip by the rising edge of the write enable signal WEB. Furthermore, in synchronization with a read enable signal REB, the state RIO0 after write is outputted from the input/output lines I/Ox (x=0 to 7).

Figure 16:
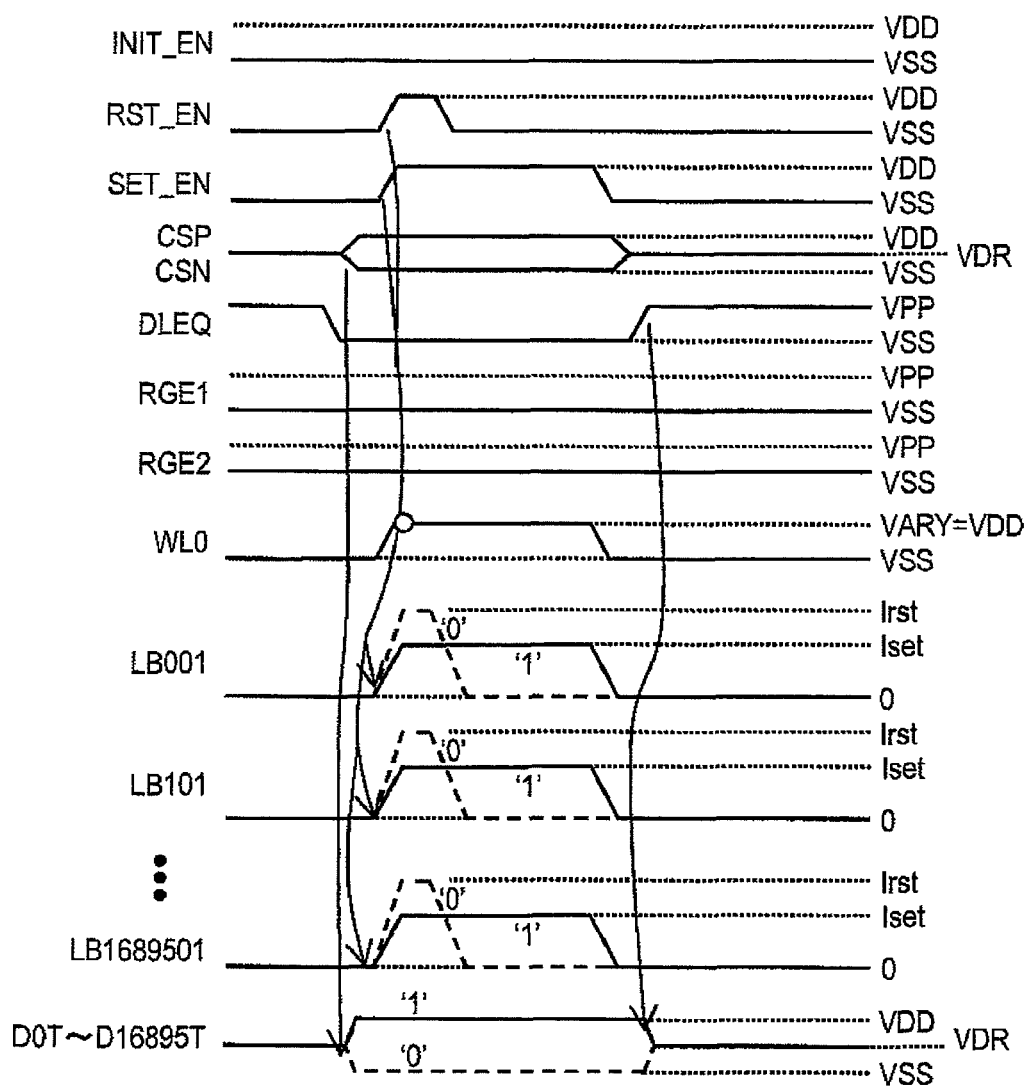
FIG. 16 is a diagram showing an example of an internal operation in the write operation of the phase change memory shown in FIG. 15 in the semiconductor device of the first embodiment of the present invention.

FIG. 16 is a diagram showing an example of a chip internal operation in the write operation of the phase change memory according to the present embodiment. The diagram shows operation waveforms of the case in which memory information is to be written to the memory cell MC1 which is in the lowermost layer of the block of stacked memory cell MB00 in the sub-memory arrays SMA0 to SMA16895 included in the memory array MA shown in FIG. 3. According to the second write command PRG2 shown in FIG. 15, the data-line equalize signal DLEQ, which is at the boosted voltage VPP, is driven to the ground voltage VSS, and the common source lines CSP and CSN, which are at the reference voltage VDR, are driven to the supply voltage VDD and the ground voltage VSS, respectively; as a result, the memory information inputted via the data lines D0T to D16895T is temporarily stored in the sense amplifiers SA in the read/write circuits RW0 to RW16895. In addition, while the operation waveforms of the first block of multiplexer MUXB1 and the second block of multiplexer MUXB2 are omitted to simplify the description, when the memory layer select signal LS0 and the bit line select signal BS0 are activated, the local bit-lines LS001, LS101, ..., LS1689501 and the common data lines CD0, CD1, ..., CD16895 are connected, respectively. Subsequently, the reset enable signal RST_EN and the set enable signal SET_EN are driven to the supply voltage VDD, and the word line WL0, which is at the ground voltage VSS, is driven to the array voltage VARY (herein, supply voltage VDD); as a result, the reset current Irst or the set current Iset is applied to the local bit-lines LB001, LB101, . . . , LB1689501 according to the memory information stored in the corresponding sense amplifiers, thereby carrying out the write operation. Note that, a pulse width of the set enable signal SET_EN is set to be larger than that of the reset enable signal RST_EN, so that the memory layer can be sufficiently crystallized and that the resistance value thereof can be lowered. Lastly, the common source line CSP, which is at the supply voltage VDD, and the common source line CSN, which is at the ground voltage VSS, are driven to the reference voltage VDR, and the data-line equalize signal DLEQ, which is at the ground voltage VSS, is driven to the boosted voltage VPP, thereby returning to a standby state.

<<Read Operation>>

Figure 17:
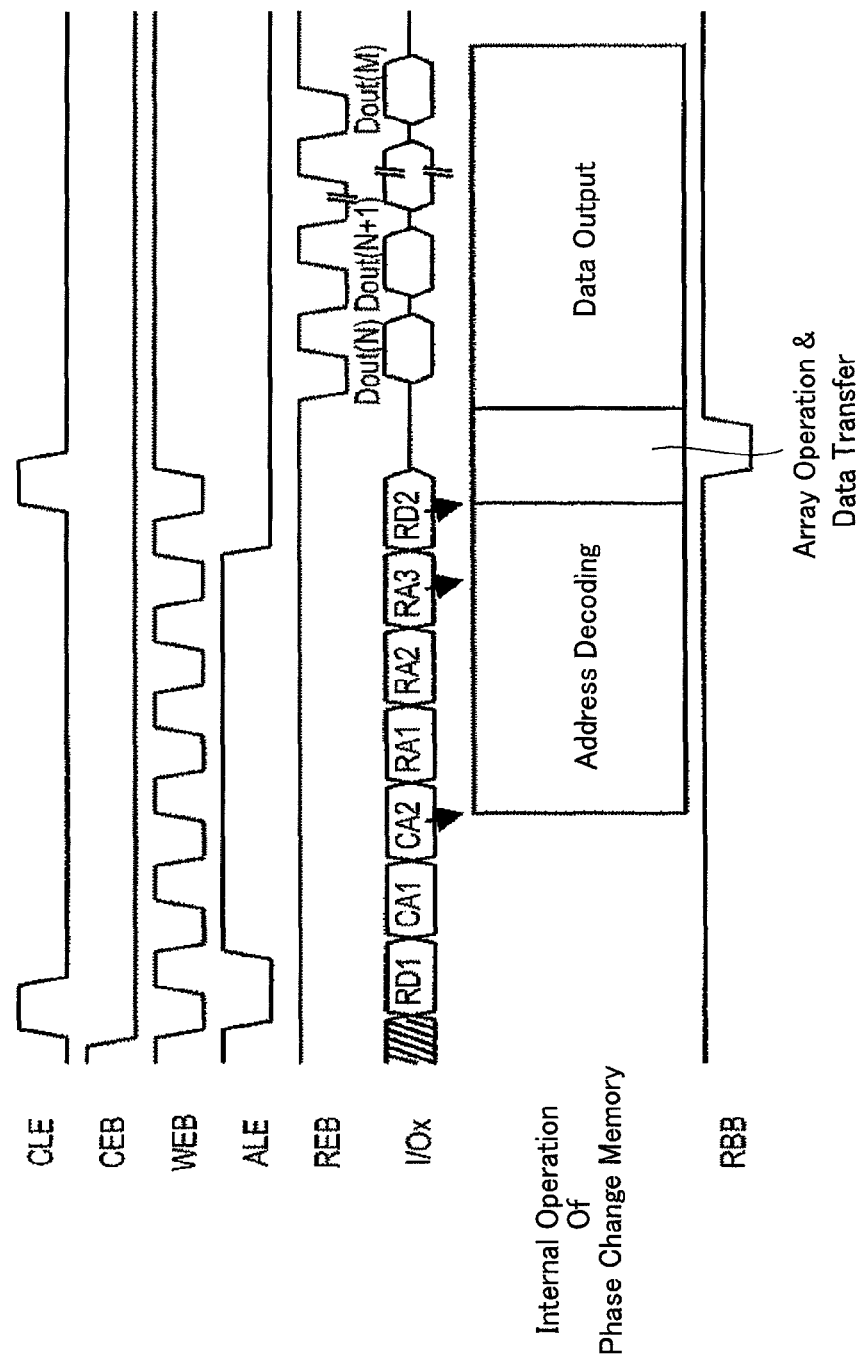
FIG. 17 is a diagram showing an example of a read operation of the phase change memory in the semiconductor device of the first embodiment of the present invention.

FIG. 17 shows an example of the read operation. The command latch enable signal CLE, which is at the low level, is driven to the high level, and the chip enable signal CEB and the address latch enable signal ALE, which are at the high level, are driven to the low level. Then, when a first read command signal RD1 is inputted via the input/output lines I/Ox (x=0 to 7), a first read command signal RD1 is retrieved to the phase change memory chip by the rising edge of the write enable signal WEB. Next, the command latch enable signal CLE, which is at the high level, is again driven to the low level, the address latch enable signal ALE, which is at the low level, is driven to the high level, and the column addresses are sequentially inputted separately in two times (CA1, CA2), and row addresses are sequentially inputted in three times (RA1, RA2, RA3). These addresses are retrieved to the phase change memory chip by the rising edges of the write enable signal WEB, and decoding of the addresses is sequentially carried out in the chip. Further, the address latch enable signal ALE, which is at the high level, is driven to the low level, the command latch enable signal CLE, which is at the low level, is driven to the high level, and a second read command signal RD2 is inputted to the input/output lines I/Ox (x=0 to 7). The second read command signal RD2 is retrieved to the phase change memory chip by the rising edge of the write enable signal WEB, thereby carrying out a read operation. In the read operation, the ready/busy signal RBB, which is at the high level, is driven to the low level. The memory information read from the memory array is transferred in the chip, and the ready/busy signal RBB, which is at the low level, is driven to the high level; then, in synchronization with the rising edges of the read enable signals REB, it is outputted in the order of Dout(N) to Dout(M).

Figure 18:
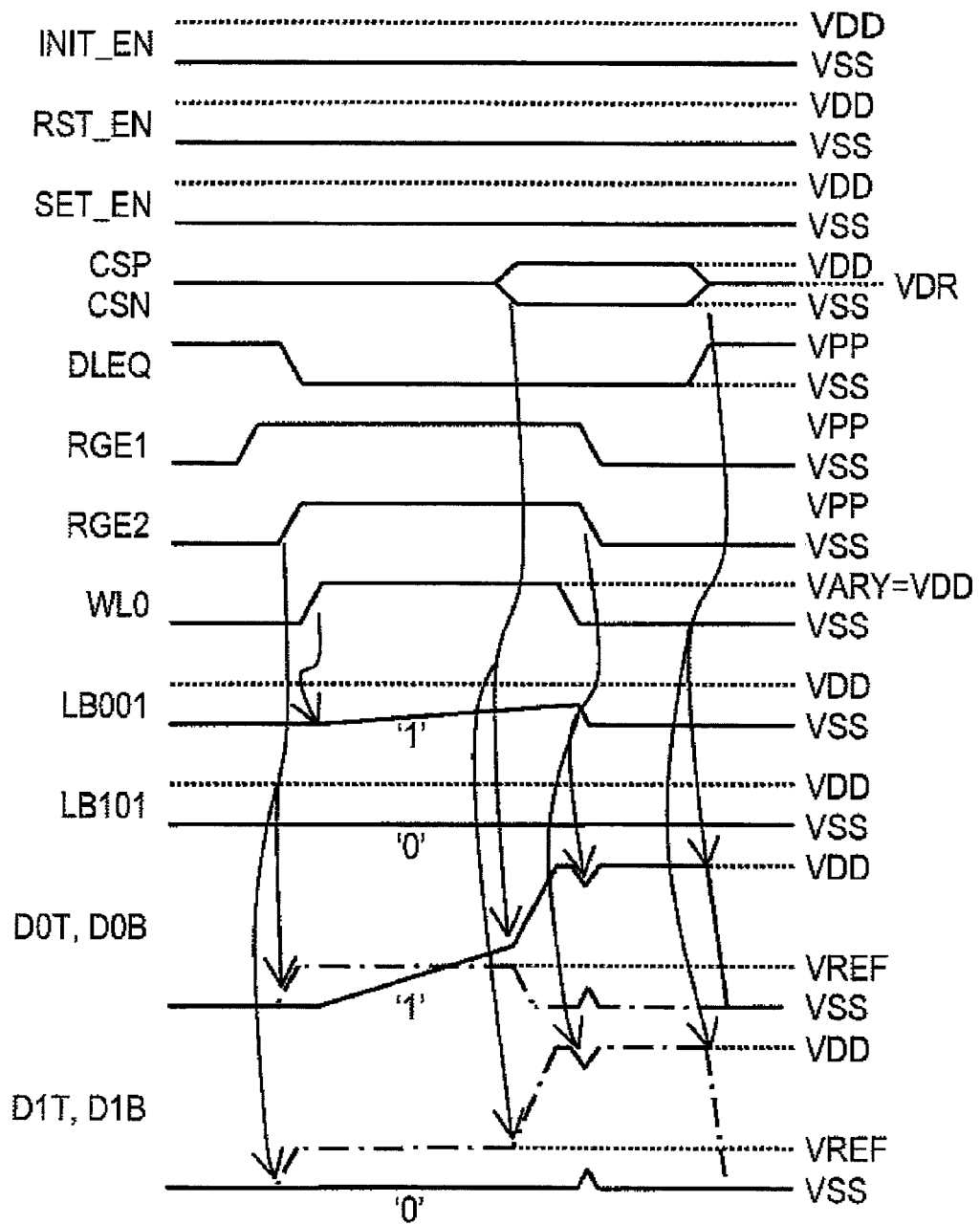
FIG. 18 is a diagram showing an example of an internal operation in the read operation of the phase change memory shown in FIG. 17 in the semiconductor device of the first embodiment of the present invention.

FIG. 18 is a diagram showing an example of the chip internal operation in the read operation of the phase change memory according to the present embodiment. The diagram shows operation waveforms of the case in which memory information is read from the memory cell MC1 which is in the lowermost layer of the block of stacked memory cell MB00 in the sub-memory arrays SMA0 to SMA16895 included in the memory array MA shown in FIG. 3. To simplify the description, the operation waveforms of the first block of multiplexer MUXB1 and the second block of multiplexer MUXB2 are omitted; however, when the memory layer select signal LS0 and the bit-line select signal BS0 are activated according to the second read command RD2 shown in FIG. 17, the local bit-lines LS001, LS101, . . . , LS1689501 and the common data lines CD0, CD1, . . . , CD16895 are connected, respectively. Next, a pass gate enable signal RGE1, which is at the ground voltage VSS, is driven to the boosted voltage VPP, and each of the local bit-lines LS001, LS101, . . . , LS1689501 is driven to the ground voltage VSS. A data-line equalize signal DLEQ, which is at the boosted voltage VPP, is driven to the ground voltage VSS, a pass gate enable signal RGE2, which is at the ground voltage VSS, is driven to the boosted voltage VPP, and the data lines D0B, D1B, . . . , D16895B are driven to the reference voltage VREF. Subsequently, when the word line, which is at the ground voltage VSS, is driven to the array voltage VARY (herein, supply voltage VDD), the local bit-lines and the data lines are driven to the voltages corresponding to the memory information. For example, when the memory cell on the local bit-line LB001 stores the information "1" and is in the low-resistance state, the local bit-line LB001 and the data line D0T are charged. On the other hand, when the memory cell stores the information "0" and is in the high-resistance state like the memory cell on the local bit-line LB101, the local bit-line LB101 and the data line D1T are maintained substantially at the ground voltage VSS. Then, like the local bit-line LB001 and the data line D0T that read the memory information "1", at the timing when the voltages thereof exceed the reference voltage VREF, the common source lines CSP and CSN, which are at the reference voltage VDR, are driven to the supply voltage VDD and the ground voltage VSS, respectively, so that the read signal is amplified. Further, the word line WL0, which is at the supply voltage VDD, is driven to the ground voltage VSS, the pass gate enable signals RGE1 and RGE2, which are at the boosted voltage VPP, are driven to the ground voltage VSS, so that the common data lines CD0, CD1, . . . , CD16895 and the data lines D0T, D1T, . . . , D16895T are disconnected, thereby avoiding data destruction that is caused by excessive voltage application. Lastly, the common source line CSP, which is at the supply voltage VDD, and the common source line CSN, which is at the ground voltage VSS, are driven to the reference voltage VDR, respectively, and the data-line equalize signal DLEQ, which is at the ground voltage VSS, is driven to the boosted voltage VPP, thereby returning to the standby state.

By virtue of the above-described configurations and operations, the following two effects are obtained. The first effect is that the integration degree of the phase change memory chip can be improved by the structure in which the memory cells comprising the memory layers using the chalcogenide material and the diodes are stacked in the manner shown in FIG. 4. The second effect is that the initialization conditions and the write conditions are changed depending on the layer in which the selected memory cell is positioned. Specifically, as shown in FIG. 10, the initialization conditions and the write conditions (herein, reset conditions) can be changed according to the operations as well as by selecting the current mirror circuit according to the operation, by the control mechanism of the reset current Irst according to the voltage setting shown in FIG. 12 and the current mirror circuits. By virtue of such a mechanism, in the initialization, deterioration of the electrical characteristics caused by application of excessive stress to the memory layers can be prevented. In addition, in the reset operation of causing the memory cell to be in the high-resistance state, it is possible to control the resistance value to a desired value. Therefore, the phase change memory with highly reliable operations can be realized.

Note that, while the case of stacking four layers of memory cells has been explained in the present embodiment, the number of stacking layers is not limited to this, and it may be two layers or eight layers. Also in such a case, similar effects can be obtained by controlling the operation conditions corresponding to the selected memory layer.

Second Embodiment

In a present second embodiment, another configuration of the write driver WD shown in FIG. 10 will be described. FIG.

19 shows a configuration example of the write deriver WD of the present embodiment. A different point between the present write circuit and the write circuit shown in FIG. 10 is that the PMOS transistors MP722, MP723, and MP724 are replaced by transistors MP725 and MP726. Dimensions of the gate widths of these transistors are in a ratio of 1:1:2 in the order of the transistors MP720, MP725, and MP726.

Figures 19, 20:
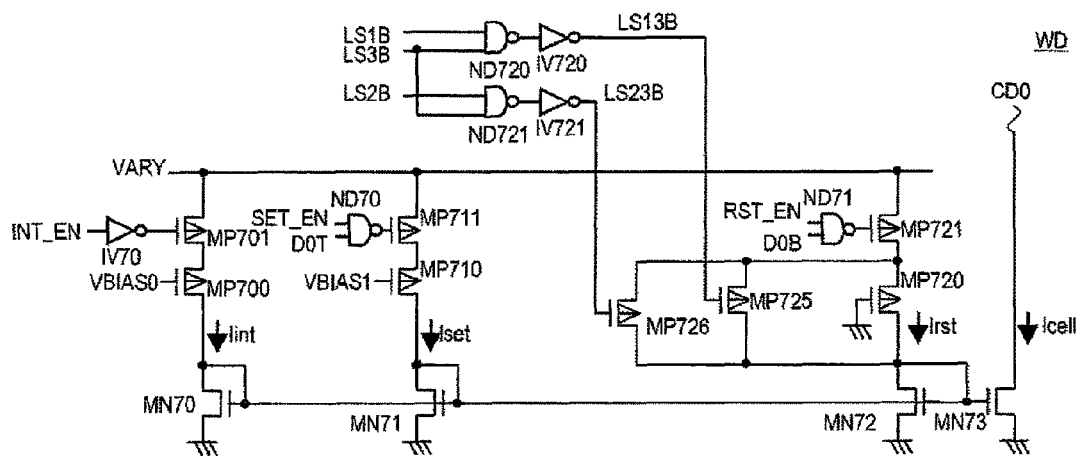
FIG. 19 is a diagram showing an example of a detailed configuration of the write driver of FIG. 1 included in the semiconductor device of a second embodiment of the present invention.
FIG. 20 is a diagram showing a relation between target memory layers for reset and reset currents in the write driver shown in FIG. 19 in the semiconductor device of the second embodiment of the present invention.

A signal LS13B obtained by inverting the output signal of a two-input NAND circuit ND720, to which the memory layer select signals LS1B and LS3B are inputted, by an inverter IV720 is inputted to a gate of the transistor MP725. A signal LS23B obtained by inverting the output signal of a two-input NAND circuit ND721, to which the memory layer select signals LS2B and LS3B are inputted, by an inverter IV721 is inputted to the gate of the transistor MP726. Four levels of the reset current Irst as shown in FIG. 20 are generated by such a configuration by using the three transistors. When the logic circuit part is shared by a plurality of write circuits, the number of the transistors in the write driver is reduced; therefore, the area of the write driver WD can be suppressed.

Third Embodiment

Figure 21:
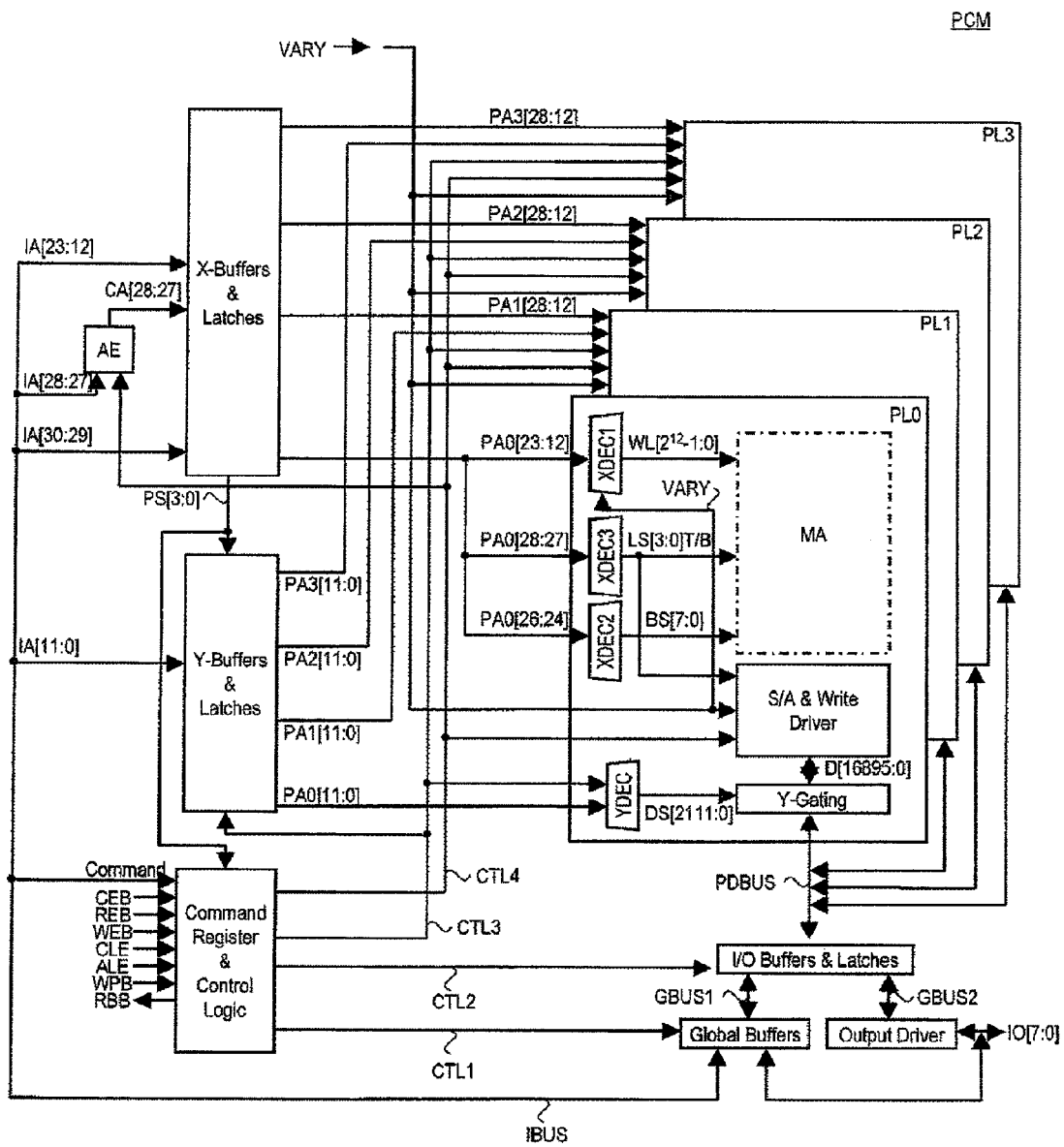
FIG. 21 is a diagram showing a configuration example of a circuit block of a main part of a phase change memory included in a semiconductor device of a third embodiment of the present invention.

In a present third embodiment, another configuration example of the phase change memory PCM shown in FIG. 1 will be described. FIG. 21 shows a configuration example of the phase change memory PCM of the present embodiment. The present phase change memory PCM has a feature to judge each memory layer whether it is a non-defective product or a defective product and using merely the memory layer that is judged to be non-defective. In order to realize such a function, a feature lies in that an address translation circuit AE is added to the configuration shown in FIG. 1. The address translation circuit AE translates the internal address IA[28:27] to an internal address CA[28:27] and transfers it to the X-buffers and latches (X-Buffers & Latches).

Figure 22:
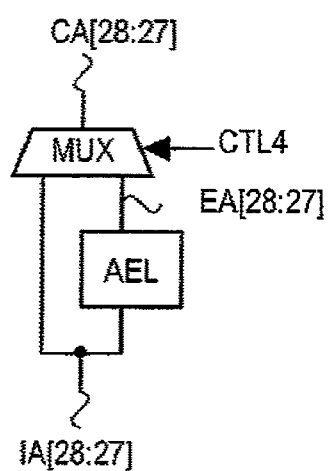
FIG. 22 is a diagram showing a configuration example of an address translation circuit in the circuit block shown in FIG. 21 in the semiconductor device of the third embodiment of the present invention.

FIG. 22 shows a configuration example of the address translation circuit AE shown in FIG. 21. The address translation circuit AE comprises an address translation logic circuit AEL and a multiplexer MUX. The address translation circuit is set to have arbitrary logics by using, for example, a fuse. The logics are different depending on the combination of the memory layers which are judged to be non-defective products, and, for example, the functions shown in FIG. 23 are realized. The functions will be described below.

In a first function, the memory layer judged to be non-defective is one layer, and an address for selecting any of the first layer to fourth layer is generated. In this case, the internal address IA[28:27] to be inputted is defined to be 00. The address translation logic circuit AEL translates the internal address IA[28:27] to any of 00, 01, 10, and 11 according to the memory layer that is judged to be non-defective.

In a second function, the memory layers judged to be non-defective are two layers, and addresses for selecting any two layers from the first layer to the fourth layer are generated. In this case, the internal address IA[28:27] to be inputted is defined to be 00 or 01. The address translation logic circuit AEL translates the internal address IA[28:27] to six patterns of combinations according to the memory layer judged to be non-defective.

In a third function, the memory layers judged to be non-defective are three layers, and addresses for selecting any three layers from the first layer to the fourth layer are generated. In this case, the internal address IA[28:27] to be inputted is defined to be either one of 00, 01, and 10. The address translation logic circuit AEL translates the internal address IA[28:27] to four patterns of combinations according to the memory layers judged to be non-defective.

In a fourth function, the memory layers judged to be non-defective are four layers, and addresses for selecting any of the first layer to fourth layer are generated. In this case, the internal address IA[28:27] to be inputted is defined to be either one of 00, 01, 10, and 11. The internal address IA[28:27] is outputted without change as an internal address EA[28:27].

The multiplexer MUX outputs either one of the internal address IA[28:27] and the internal address EA[28:27] as the internal address CA[28:27] according to the block of control signal CTL4. The block of control signal CTL4 has, as shown in FIG. 24, an initialization mode signal INIT, a test mode signal TEST, and a normal mode signal NORM. The initialization mode signal INIT is activated by the first and second initialization command signals IN1 and IN2 as shown in FIG. 13. The normal operation mode signal NORM is activated by the first and second program command signals PRG1 and PRG2 or the first and second read command signals RD1 and RD2 as shown in FIG. 15 or FIG. 17. The test mode signal TEST is activated when first and second program command signals TPRG1 and TPRG2 or first and second read command signals TRD1 or TRD2 are input upon testing instead of the first and second program command signals PRG1 and PRG2 or the first and second read command signals RD1 and RD2 shown in FIG. 15 or FIG. 17. According to the operation mode signals described above, in an initialization mode and a test mode, the internal address IA[28:27] is selected and outputted to the internal address CA[28:27]. Also, in a normal operation mode, the internal address EA[28:27] translated by the address translation logic circuit AEL is selected and outputted to the internal address CA[28:27].

The following effects can be obtained by the configuration and operations of the address translation circuit AE described above. Specifically, when initialization and testing of the write operation and the read operation are to be carried out, non-defective products or defective products can be identified by selecting all memory layers and carrying out desired operations by translating the internal address IA[28:27] to the internal address EA[28:27] as shown in FIG. 23. In addition, when setting of the address translation logic circuit AEL is made for each chip according to characteristic determinations per the memory layers, only the memory layers having good characteristics can be selected, and a so-called partially good memory chip which can operate as a memory can be realized. By virtue of such partially good products, the number of chips obtained per a wafer can be improved so that bit cost can be reduced.

Fourth Embodiment

In the present embodiment, a system for checking valid memory layers in the partially good memory chip described in the third embodiment will be described. The present system has a feature to write information on whether the memory layer having the corresponding page is valid or not in a spare field of an arbitrary page in the page configuration shown in FIG. 7 before chip shipping. More specifically, as shown in FIG. 5, the information on whether the memory layer is valid or not is written to the memory cells selected by the column address 2049 in the spare fields of first and second pages Page 0 and Page 1 of the top blocks Block 0, Block 2048, Block 4096, and Block 6144 in the main blocks, Main-block 0, Main-block 4, Main-block 8, and Main-block 12 in the memory plane PL0. The spare field is not required to comprise the same memory as the main block, but may comprise another non-volatile memory.

Hereinafter, it is assumed that, when memory information is "FFh", a corresponding memory layer is valid, and when the memory information is other than "FFh", the corresponding memory layer is invalid.

Figure 25:
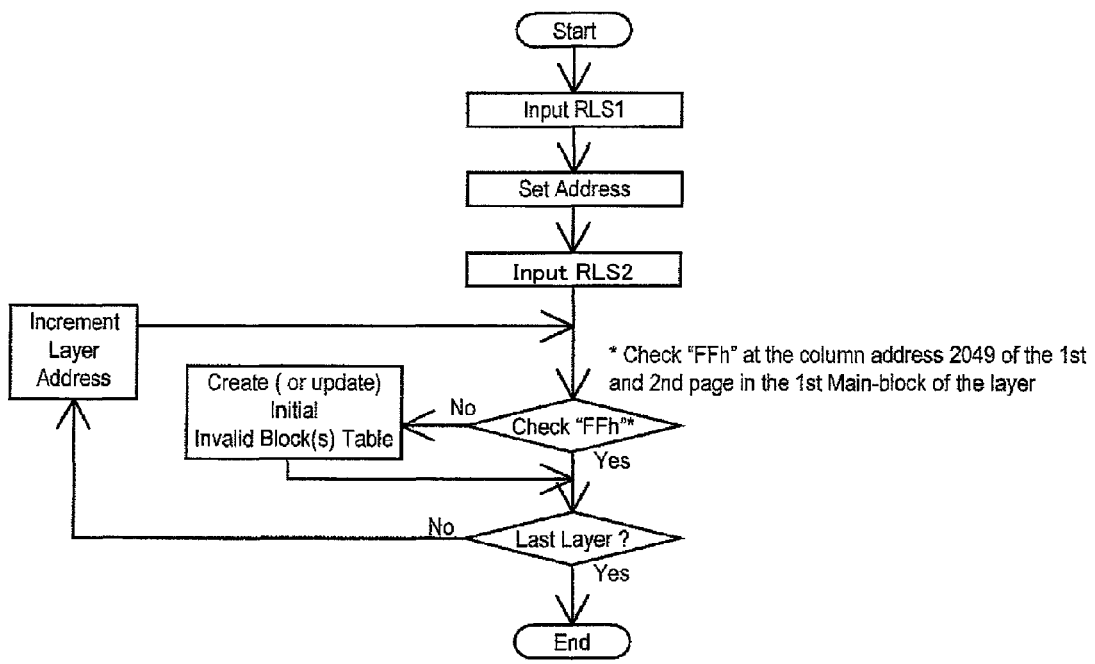
FIG. 25 is a diagram showing a flow chart of a read operation for checking validity of memory layers of a phase change memory included in a semiconductor device of a fourth embodiment of the present invention.

FIG. 25 shows a flow chart of a read operation for checking validity of a memory layer. First, a memory layer check command signal RLS1 is inputted. Next, an address signal corresponding to the column address 2049 and a row address signal shown in FIG. 8 by which the above-described page is selected are inputted. Further, a memory layer check command signal RLS2 is inputted, and the memory information of a desired spare field is read. Herein, if the corresponding memory layer is valid, the memory information "FFh" is notified to a so-called host-side device such as a memory controller or a central processing unit connected to the outside of the phase change memory chip. On the other hand, if the corresponding memory layer is invalid, information other than the memory information "FFh" is notified to a device in a so-called host side such as a memory controller or a central processing unit connected to the outside of the phase change memory chip. The host-side device stores the thus-notified information in an invalid layer table (Invalid Layer Table). Such an operation is repeated while incrementing the memory layer addresses one by one so that the invalid layer table is created.

Figure 26:
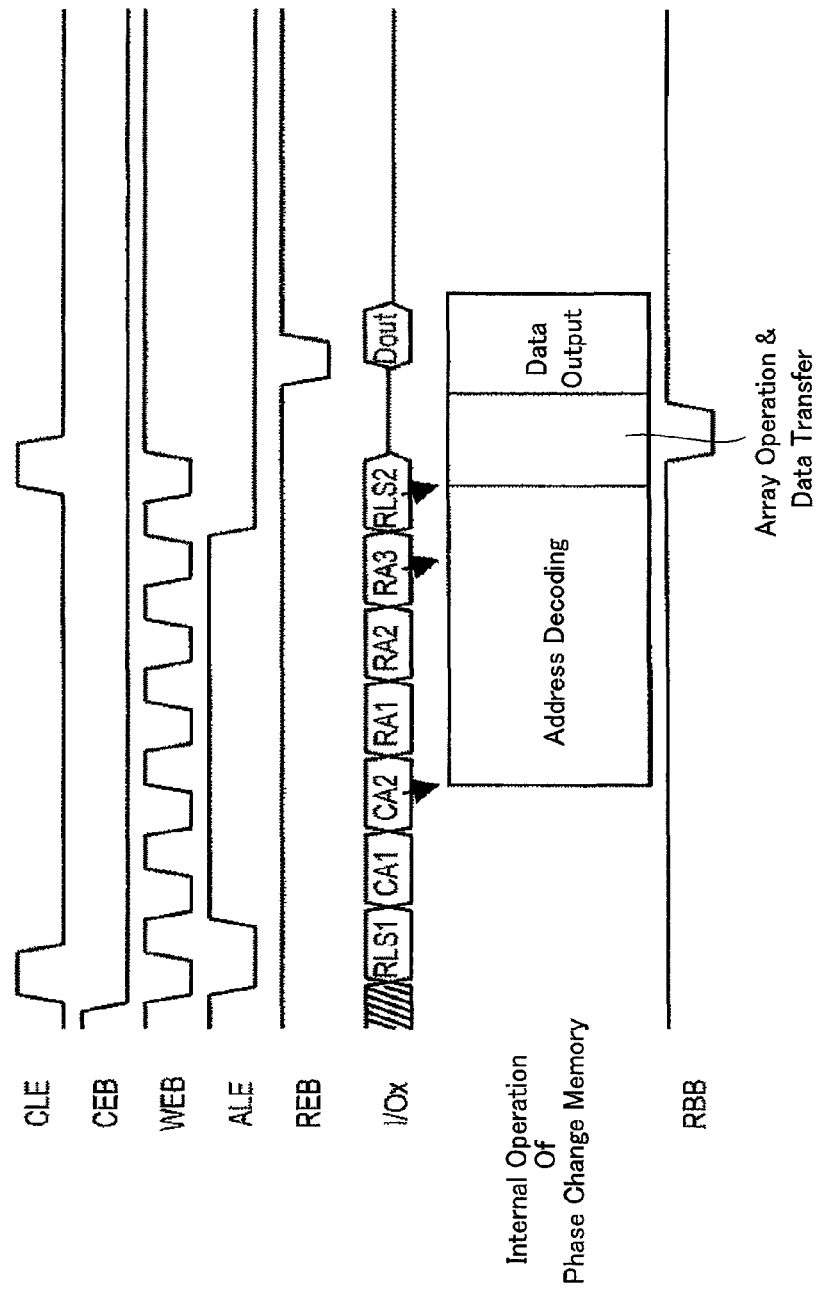
FIG. 26 is a diagram showing a modification example of the read operation of the phase change memory included in the semiconductor device of the fourth embodiment of the present invention.

FIG. 26 shows the read operation part in the flow chart shown in FIG. 25. The operation principles are same as the read operation shown in FIG. 17. Regarding first and second command signals, the read command signals RD1 and RD2 shown in FIG. 17 are replaced by the memory layer check command signals RLS1 and RLS2. In addition, a feature lies in a point that only the memory information of the column address 2049 in a top page or a subsequent page is read.

FIG. 27 is a diagram showing another function of the multiplexer MUX shown in FIG. 22. The function of the multiplexer MUX in the present embodiment is expanded by memory layer check command signals RLS generated from the first and second memory layer check command signals RLS1 and RLS2. More specifically, when the memory layer check command signal RLS is activated, the internal address IA[28:27] is selected and outputted to the internal address CA[28:27]. Note that, the memory layer check command signal RLS newly added in the present embodiment is a component of the block of control signal CTL4.

The following effects can be obtained by the above-described configuration and operations. More specifically, the host-side device is capable of understanding which memory layers are valid or not by reading the memory information of the spare field of each of the memory layers by using the first and second memory layer check command signals RLS1 and RLS2. Therefore, it becomes easy to build a system by combining phase change memory chips having various capacities and to add phase change memory chips.

Figures 28, 29:
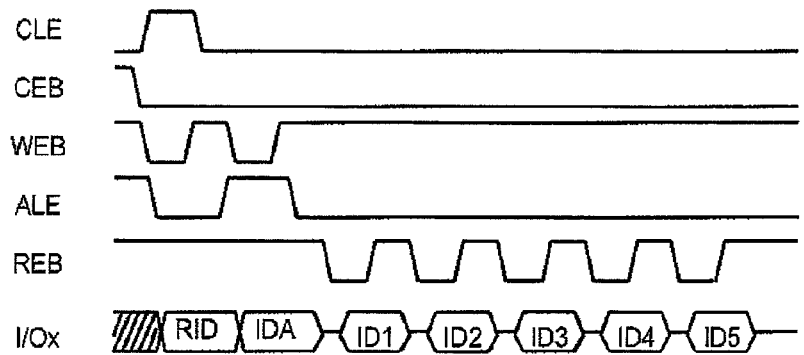
FIG. 28 is a diagram showing an example of a device ID read operation of the phase change memory included in the semiconductor device of the fourth embodiment of the present invention.
FIG. 29 is a diagram showing an example of contents of device IDs in the semiconductor device of the fourth embodiment of the present invention.

Note that, the method of checking validity of the memory layers is not limited to this, but there are various methods. For example, a device identification table may be provided in the phase change memory chip, so that information about memory plane capacities can be stored. FIG. 28 shows a timing chart of a device ID read operation, and FIG. 29 shows a device identification table. The device ID read operation shown in FIG. 28 is based on the read operation shown in FIG. 17, and the device IDs shown in FIG. 29 are sequentially read by a device ID read command signal RID. A chip user (herein, the host-side device) is capable of understanding a valid chip capacity of the phase change memory and target address signals for input according to the memory plane capacity.

Fifth Embodiment

Figure 30:
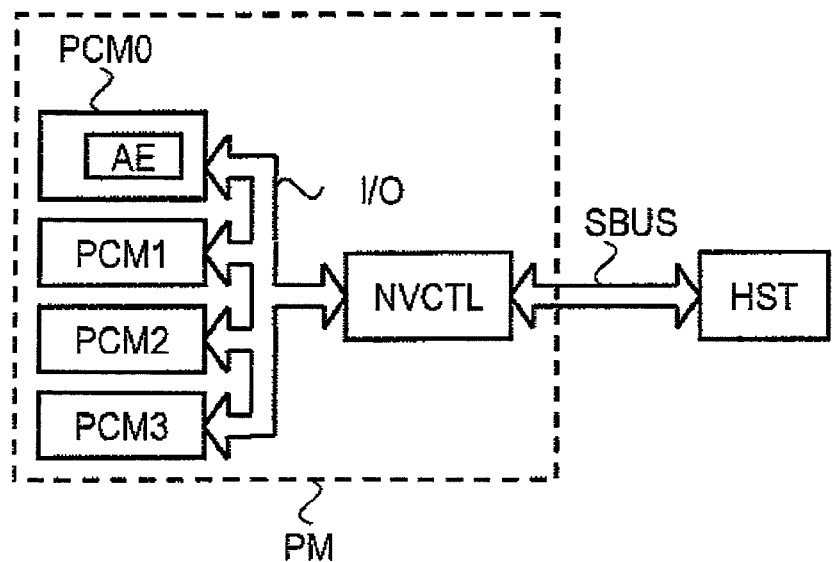
FIG. 30 is a diagram showing a configuration example of a block of a main part in a semiconductor device of a fifth embodiment of the present invention.

In the present embodiment, a phase change memory module formed by using a plurality of phase change memory chips described in the third embodiment and the fourth embodiment will be described. FIG. 30 shows a configuration of the phase change memory module PM according to the present embodiment. The diagram shows, as an example, the configuration using four phase change memory chips PCM0 to PCM3 and a non-volatile memory controller NVCTL.

The non-volatile memory controller NVCTL has the invalid layer table (Invalid Layer Table) described in the third embodiment and the fourth embodiment. It also has a wear leveling (Wear Leveling) function for leveling the number of times of writing in memory cells and a garbage collection function for assembling free spaces dispersed in the memory space. Each of the phase change memory chips PCM0 to PCM3 has the address translation circuit AE shown in FIGS. 21 and 22. The address translation circuit AE translates an input address signal to an internal address signal for selecting a valid memory layer. The non-volatile memory controller NVCTL and the phase change memory chips PCM0 to PCM3 are connected by input/output lines I/O. The non-volatile memory controller NVCTL is connected to a host device via a system bus SBUS. By virtue of such a configuration, a large-capacity storage device comprising a combination of phase change memory chips having various capacities can be built.

Sixth Embodiment

Figure 31:
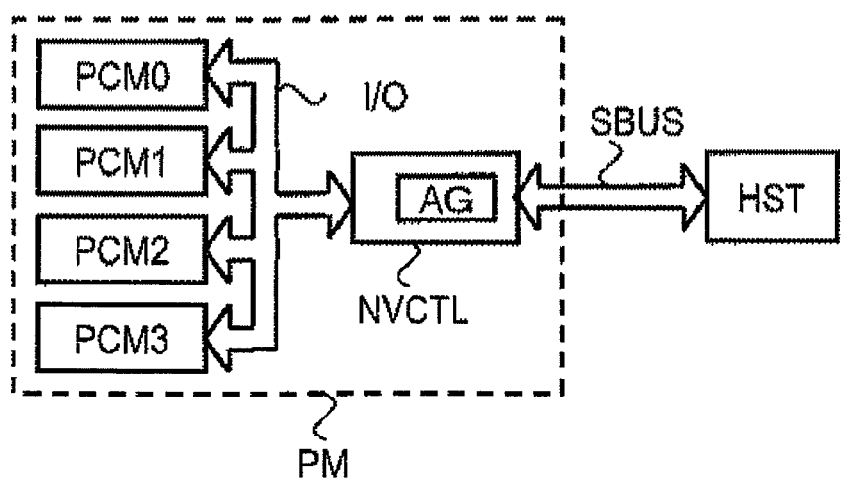
FIG. 31 is a diagram showing another configuration example of the block of a main part in a semiconductor device of a sixth embodiment of the present invention.

In a present embodiment, another configuration of the phase change memory module formed by using the above-described plurality of phase change memory chips will be described. FIG. 31 shows the configuration of the phase change memory module PM according to the present embodiment. FIG. 31 shows, as an example, the configuration using the four phase change memory chips PCM0 to PCM3 and the non-volatile memory controller NVCTL. Herein, the four phase change memory chips PCM0 to PCM3 do not have the address translation circuit described in the third embodiment and the fourth embodiment.

A difference from the phase change memory module shown in FIG. 30 lies in a point that the non-volatile memory controller NVCTL has an address generation circuit block AG having an address translation function like that shown in FIG. 23. The non-volatile memory controller NVCTL carries out the read operation for checking validity of memory layers shown in FIG. 18 and FIG. 19 at every power-on and builds an invalid layer table (Invalid Layer Table). The address translation functions are put together in the non-volatile memory controller NVCTL; as a result, the chip area of the phase change memory chips PCM0 to PCM3 can be reduced.

Seventh Embodiment

In the present embodiment, another example of the semiconductor device of the first embodiment will be described. The present embodiment has a feature in the block of control signal CTL4 shown in FIG. 1 that further has four types of reset enable signals RST_EN0 to RST_EN3 and that the reset enable signals are selected according to the memory layer to which memory information is to be written.

Figures 32, 33:
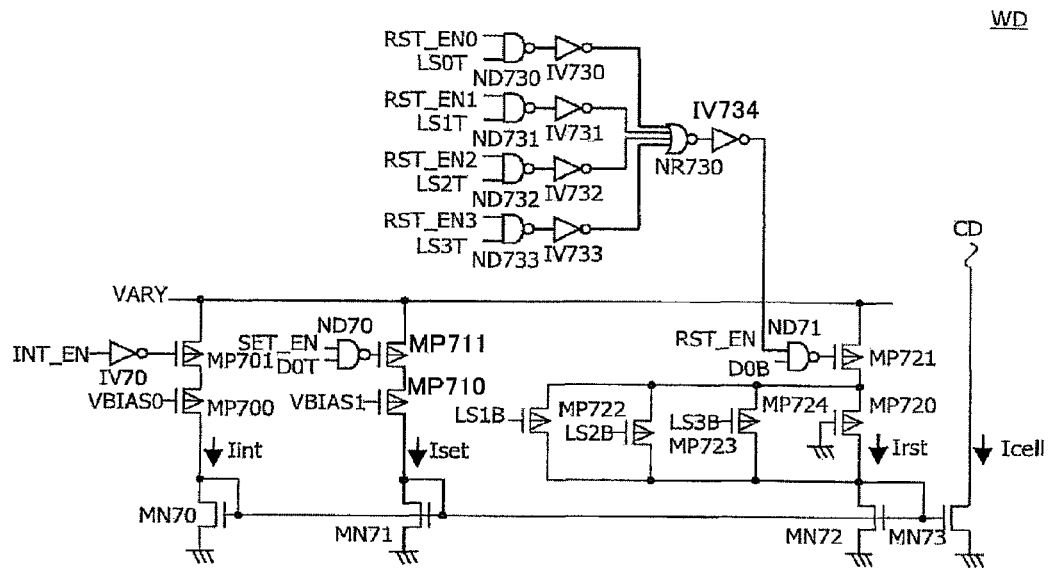
FIG. 32 is a diagram showing an example of a detailed configuration of the write driver of FIG. 1 included in a semiconductor device of a seventh embodiment of the present invention.
FIG. 33 is a diagram showing a relation between target memory layers for reset and reset current in the write driver shown in FIG. 32 in the semiconductor device of the seventh embodiment of the present invention.

FIG. 32 shows another configuration example of the write driver of FIG. 1. A feature in FIG. 32 is that the reset enable signal corresponding to the activated memory layer select signal is selected by carrying out AND logic operations of the reset enable signals RST_EN0 to RST_EN3 and the memory layer select signal LS[3:0] by using NAND circuits ND730 to ND733 and inverters IV730 to IV733. The output signals of the inverters IV730 to IV733, which are the results of the AND logical operations, are inputted to four-input NOR circuit NR730, and the reset enable signal generated by inverting the output signal thereof by an inverter IV734 is inputted to the NAND circuit ND71.

Figure 34:
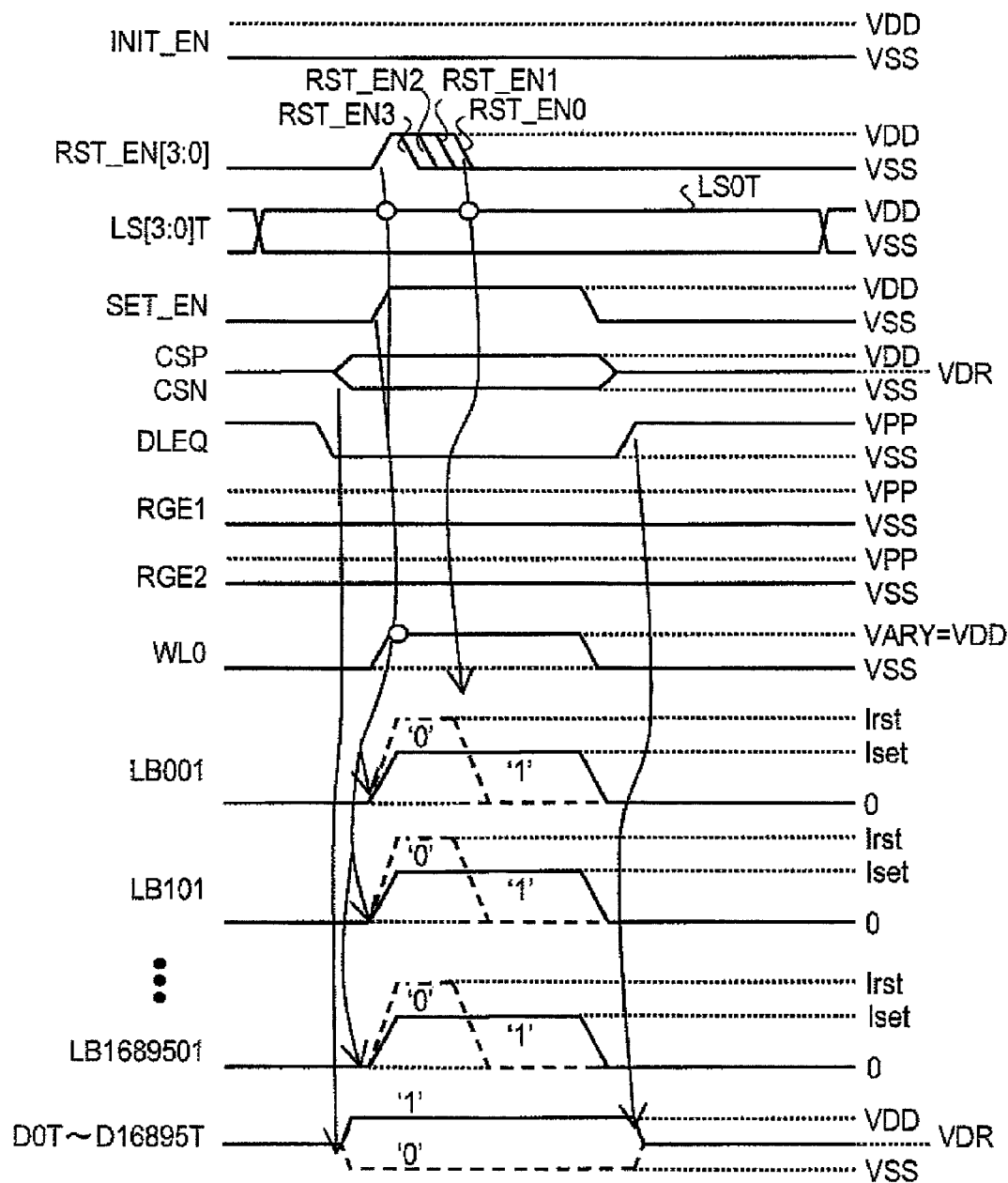
FIG. 34 is a diagram showing an example of an internal operation in a write operation of the phase change memory shown in FIG. 22 in the semiconductor device of the seventh embodiment of the present invention.

FIG. 34 is a diagram showing an example of chip internal operations in the write operation of the phase change memory in the semiconductor device shown in FIG. 23. This diagram shows operation waveforms of the case in which memory information is to be written to the memory cell MC1 which is in the lowermost layer of the block of stacked memory cell MB00 in the sub-memory arrays SMA0 to SMA16895 included in the memory array MA shown in FIG. 3. The pulse widths of the reset enable signals RST_EN[3:0] are set to be larger in order of the reset enable signals from RST_EN3 to RST_EN0. These pulses are selected in the write driver shown in FIG. 23. Herein, the memory layer to which the memory information is to be written is the lowermost layer; therefore, when the memory layer select signal LS0 is activated, the reset enable signal RST_EN0 having a large pulse width is selected as shown in FIG. 33. A reset operation is carried out by the reset enable signal RST_EN0 corresponding to the memory information.

The following effects are obtained by the above-described configuration and operations. More specifically, the lower the layer having a relatively low resistance value in which the memory cell is positioned, the longer the current drive time in the reset operation is made; as a result, the resistance of the storage layer can be increased up to a desired value. When it is combined with an adjustment function of the applied current like the write driver shown in FIG. 32, the reset operation can be more reliably carried out.

Eighth Embodiment

In a present embodiment, another configuration of the phase change memory chip, which has been described above, will be described. FIG. 35 shows the configuration based on the phase change memory chip shown in FIG. 1. Features in FIG. 35 are the following three points.

A first feature lies in a point that a plurality of voltages V[3:0] are generated in the chip by using an internal voltage generating circuit VGEN. The internal voltage generating circuit VGEN generates the plurality of voltages from the supply voltage VDD and the ground voltage VSS. The supply voltage VDD is supplied to the logic circuit, and the plurality of voltages are supplied to the memory array; consequently, the operation of the logic circuit and drive of the plurality of voltages can be stabilized.

A second feature lies in a point that the voltage supply lines of the generated voltages V[3:0] are lead to pads PAD_V0 to PAD_V3, respectively. By virtue of such a configuration, whether desired voltages are generated in the chip or not can be readily measured.

A third feature lies in a point that a voltage select circuit VSEL is provided in each of the memory planes PL0 to PL3. The voltage select circuit VSEL selects a value corresponding to the initialization enable signal INIT_EN, which is a component of the block of control signal CTL4, and the memory layer select signals LS[3:0], and outputs the same as the array voltage VARY. The array voltage VARY, which is controlled to an appropriate value, is supplied to the word line WL via the first row decoder XDEC1 and is also supplied to the write driver WD. By virtue of such voltage control, initialization of the memory cell can be carried out at an optimum voltage for each layer according to the resistance value which is different in each layer due to the difference of electrical characteristics.

Specifically, the array voltage VARY is set as shown in FIG. 36. When the memory cell of the first memory layer (lowermost layer) is to be initialized, the memory layer select signal LS0 is activated (herein, it is driven to the supply voltage VDD), thereby driving the array voltage VARY to the first voltage V0. When the memory cell of the second memory layer is to be initialized, the memory layer select signal LS1 is activated (herein, it is driven to the supply voltage VDD), thereby driving the array voltage VARY to the second voltage V1 which is higher than the first voltage V0. When the memory cell of the third memory layer is to be initialized, the memory layer select signal LS2 is activated (herein, it is driven to the supply voltage VDD), thereby driving the array voltage VARY to the third voltage V2 which is higher than the second voltage V1. When the memory cell of the fourth memory layer (uppermost layer) is to be initialized, the memory layer select signal LS3 is activated (herein, it is driven to the supply voltage VDD), thereby driving the array voltage VARY to the fourth voltage V3 which is higher than the third voltage V2. The above-described voltages satisfy the above-described relation of (Expression 1).

When the initialization is carried out by supplying the optimal voltages to the respective layers, deterioration of the electrical characteristics caused by excessive application of stress to the memory layers can be prevented, and thus the phase change memory of high reliability can be realized.

When the initialization enable signal INIT_EN is in a non-active state (herein, it is driven to the ground voltage VSS), the phase change memory according to the present invention carries out a read operation or a write operation. In this case, the array voltage VARY is set to the supply voltage VDD independent of the state of the memory layer select signals LS[3:0]. The array voltage VARY can be supplied from outside. This is because one time of initialization is satisfactory in a test or the like upon shipping, and that supplying the voltage required for the initialization in the test or the like upon shipping is satisfactory. The array voltages corresponding to the memory layers can be supplied by providing dedicated pins of the array voltage VARY. However, since the desired initialization can be carried out even by merely adjusting the value of the supply voltage VDD, the operations of the present embodiment can be realized by adjusting the voltage applied to pins of the supply voltage VDD. In this case, since the number of pins can be suppressed, the area of the memory chip can be reduced.

In the foregoing, the invention made by the inventors of the present invention has been concretely described based on the embodiments. However, it is needless to say that the present invention is not limited to the foregoing embodiments and various modifications and alterations can be made within the scope of the present invention. For example, the stacked memory cells are not limited to four layers, and they may be more than that or less than that (for example, two layers or eight layers). Meanwhile, the array voltage in the initialization is not limited to the setting in which the higher the layer is, the higher the voltage is; and other settings are possible depending on the characteristics of the memory cells. For example, the array voltage can be set to be lower with respect to a higher layer in the case in which the higher the layer of the memory cell is, the lower the resistance value thereof becomes, due to some reasons that, for example, the higher the layer of the memory cell is, the larger the variation of processing dimensions is. Similarly, the reset current Irst in the reset operation can be set so that the higher the layer is, the smaller the current is. Also, the width of the reset enable signal RST_EN in the reset operation can be set so that the higher the layer is, the smaller the width is. Furthermore, not only in the reset operation, but also in the set operation, similar optimization of the write conditions can be carried out depending on the electrical characteristics of the memory cells. The present invention can be applied not only to a single memory chip, but also to an interface of on-chip memory. The concept of the present invention can be applied not only to phase change memories, but also to various semiconductor memories such as flash memories, dynamic random access memories, static random access memories, and magnetoresistive random access memories.

The semiconductor device of the present invention prevents excessive stress to the recording layers and avoids deterioration of the electrical characteristics of the recording layers by adjusting the initialization conditions and reset operation conditions according to the layer in which the accessed memory cell is positioned. When capacity increase of a semiconductor memory is advanced, memory arrays are caused to be three dimensional by stacking. When the stacking number of memory cells is increased, differences in the thermal history among the memory cells become larger, and thus differences in the electrical characteristics of the memory array are increased. However, according to the present invention, the operation conditions can be optimized for each layer, and it is thus suitable for highly reliable technology of futuristic semiconductor devices having stacked memory arrays.

What is claimed is:

1. A semiconductor device comprising:
    a plurality of memory planes each including a memory array having a plurality of memory cells to which memory information is written using current, and which are stacked upon each other;
    a plurality of voltage supply lines connected to said plurality of memory planes;
    a voltage generating circuit supplying a plurality of voltages which are different from each other to said plurality of memory planes via the voltage supply lines; and
    a plurality of pads for connecting the voltage supply lines to an outside of the semiconductor device.

2. The semiconductor device according to claim 1,
    wherein each of the voltages is set to an array voltage of the memory array when a memory array corresponding to said array voltage is initialized.

3. The semiconductor device according to claim 1, further comprising:
    control logic which supplies an initialization enable signal to the memory planes,
    wherein each of the memory planes further includes a voltage select circuit which outputs one of the voltages as an array voltage of the memory array if the initialization enable signal is in an active state, and which outputs a supply voltage as the array voltage if the initialization enable signal is in a non-active state.

4. The semiconductor device according to claim 1,
    wherein the voltage supplied to a memory plane that is higher than another one of said plurality of memory planes is larger than that supplied to said another memory plane that is lower than said higher memory plane.

5. The semiconductor device according to claim 1,
    wherein all of the voltages are lower than a supply voltage.

6. The semiconductor device according to claim 1,
    wherein each of the memory cells has a phase change element.

7. A semiconductor device comprising:
    a plurality of memory planes each including a memory array having a plurality of memory cells to which memory information is written using current, and which are stacked upon each other;
    a plurality of voltage supply lines connected to said plurality of memory planes; and
    a voltage generating circuit supplying a plurality of voltages which are different from each other to said plurality of memory planes via the voltage supply lines,
    wherein each of the voltages is set to an array voltage of the memory array when a memory array corresponding to said array voltage is initialized.

8. The semiconductor device according to claim 7, further comprising;
    control logic which supplies an initialization enable signal to the memory planes,
    wherein each of the memory planes further includes a voltage select circuit which outputs one of the voltages as an array voltage of the memory array if the initialization enable signal is in an active state, and which outputs a supply voltage as the array voltage if the initialization enable signal is in a non-active state.

9. The semiconductor device according to claim 7,
    wherein the voltage supplied to a memory plane that is higher than another one of said plurality of memory planes is larger than that supplied to said another memory plane that is lower than said higher memory plane.

10. The semiconductor device according to claim 7,
    wherein all of the voltages are lower than a supply voltage.

11. The semiconductor device according to claim 7,
    wherein each of the memory cells has a phase change element.

* * * * *